US006437341B1

(12) United States Patent
Izumi et al.

(10) Patent No.: US 6,437,341 B1
(45) Date of Patent: Aug. 20, 2002

(54) ACTIVE-MATRIX SUBSTRATE, TWO-DIMENSIONAL IMAGE DETECTOR HAVING THE SAME, AND PIXEL DEFECT CORRECTING METHOD OF TWO-DIMENSIONAL IMAGE DETECTOR

(75) Inventors: Yoshihiro Izumi, Kashihara; Hisashi Nagata, Nara, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 50 days.

(21) Appl. No.: 09/692,476

(22) Filed: Oct. 20, 2000

(30) Foreign Application Priority Data

Nov. 2, 1999 (JP) .......................................... 11-312858

(51) Int. Cl.$^7$ .............................................. H01J 27/00
(52) U.S. Cl. .............................. 250/370.13; 250/370.08
(58) Field of Search ...................... 250/370.13, 370.08, 250/370.09, 370.11, 370.14, 370.16, 338.4, 332, 208.1

(56) References Cited

U.S. PATENT DOCUMENTS

| | | | |
|---|---|---|---|
| 4,413,882 A | * 11/1983 | Bailey et al. ............... 350/96.3 |
| 4,471,371 A | * 9/1984 | Hamano ....................... 357/31 |
| 4,940,901 A | * 7/1990 | Henry et al. ........... 250/370.09 |
| 5,319,206 A | 6/1994 | Lee et al. |
| 5,379,336 A | 1/1995 | Kramer et al. |
| 5,463,216 A | 10/1995 | Van Berkel |
| 5,717,215 A | * 2/1998 | Inushima et al. ........... 250/372 |
| 5,723,866 A | 3/1998 | Hamilton |
| 6,035,013 A | 3/2000 | Orava et al. |
| 6,091,194 A | * 7/2000 | Swirbel et al. .............. 313/498 |
| 6,242,729 B1 | * 6/2001 | Izumi et al. ............. 250/208.1 |
| 2001/0019371 A1 | * 9/2001 | Zavracky et al. ............... 349/5 |

FOREIGN PATENT DOCUMENTS

| | | |
|---|---|---|
| EP | 0 523 783 A | 1/1993 |
| EP | 0 602 475 A | 6/1994 |
| EP | 0 783 177 A | 7/1997 |
| JP | 6-342098 | 12/1994 |

OTHER PUBLICATIONS

Denny L. Lee et al.: "A New Digital Detector for Projection Radiography" SPIE vo. 2432, pp. 237–249, (May/1995).
L. S. Jeromin et al.: "Application of a–Si Active Matrix Technology in a X–Ray Detector Panel" SID International Symposium, Digest of Technical Papers, pp. 91–94, (May/1997).
U.S. Ser. No. 09/239,855, Teranuma et al., filed Jan. 1999.
U.S. Ser. No. 09/229,269, Kramer et al., filed Jan. 1999.

* cited by examiner

*Primary Examiner*—Constantine Hannaher
*Assistant Examiner*—Otilia Gabor

(57) ABSTRACT

An active-matrix substrate 10a includes electrode wires having gate electrodes 2 and data electrodes 3 arranged in a lattice form, thin-film transistors 4 provided respectively at intersections of the lattice form, a pixel electrode 11 connected to the data electrode 3 via the thin-film transistor 4, and a storage capacitor 5 connected to the pixel electrode 11. A connecting electrode 13 having a long length is provided for readily cutting by laser on a part of an electrode for connecting the data electrode 3 and the pixel electrode 11. With this arrangement, it is possible to provide the active-matrix substrate being able to readily suppress leakage of unnecessary electrical charge from a pixel defect, which may cause a line defect.

21 Claims, 16 Drawing Sheets

17: LASER CUT POINT

ACTIVE-MATRIX SUBSTRATE, TWO-DIMENSIONAL IMAGE DETECTOR HAVING THE SAME, AND PIXEL DEFECT CORRECTING METHOD OF TWO-DIMENSIONAL IMAGE DETECTOR

FIELD OF THE INVENTION

The present invention relates to a two-dimensional image detector such as an X-ray sensor and an image sensor, that is used in an X-ray pickup device or an X-ray diagnostic image display device for forming an X-ray image passing through a human body and that is capable of detecting an image of radiation such as an X-ray, visible light, and infrared light, and the present invention further concerns an active-matrix substrate used for the detector and a pixel defect correcting method of the two-dimensional image detector.

BACKGROUND OF THE INVENTION

Conventionally, as a flat-panel image sensor for radiation that serves as a two-dimensional image detector, the following construction has been known: semiconductor sensors are two-dimensionally arranged in a row direction and a column direction, a switching element is provided for each pixel electrode, and the switching elements are successively turned on for each column so as to read electrical charge for each column. The semiconductor sensor is formed by stacking a semiconductor layer with photoconductivity and a pixel electrode, and the semiconductor sensor detects an X-ray and generates electrical charge (electron-hole pair).

The construction and principle of such a flat-panel image sensor are described in "D. L. Lee, et al., 'A New Digital Detector for Projection Radiography', SPIE, 2432, pp. 237–249, 1995" (published in 1995), "L. S. Jeromin, et al., 'Application of a-Si Active-Matrix Technology in a X-ray Detector Panel', SID 97 DIGEST, pp. 91–94, 1997" (published in 1997), and Japanese Laid-Open Patent Publication No.342098/1994 (Tokukaihei 6-342098, published on Dec. 13, 1994).

The following briefly describes the construction and principle of the conventional flat-panel image sensor.

Firstly, as an active-matrix substrate used for the flat-panel image sensor, it is possible to adopt an active-matrix substrate used in a liquid crystal display device and so on.

Namely, as shown in FIGS. 18 and 19, an active-matrix substrate 101 is provided with electrode wires having gate electrodes 102 and data electrodes 103 arranged in a lattice form. Each intersection includes a thin-film transistor ("TFT: Thin Film Transistor") 104 acting as a switching element, a pixel electrode 110 connected via the TFT 104 to the data electrode 103, and a storage capacitor (Cs) 106 connected in series with the pixel electrode 110.

A photoconductive film 107 for directly converting light, an X-ray, etc. to electrical charge is formed on an upper layer of the active-matrix substrate 101 so as to complete a two-dimensional image detector such as an X-ray sensor and a flat-panel image sensor 100.

In other words, electrical charge generated by the photoconductive film 107 is accumulated in the storage capacitor (Cs) 106 by a high voltage, data is stored as electrical charge of each pixel according to the pattern of a subject. The data is successively scanned by the gate electrodes 102 acting as scanning lines, a circuit such as an operation amplifier for reading pixel data as a signal, which is selected by the scanning line, takes out an object projected on a sensor as an image data.

Incidentally, on the active-matrix substrate 101, in the event of a defect on the TFTs 104 or a property defect on the photoconductive film 107, etc. in a pixel, the pixel is recognized as a pixel defect (point defect).

Additionally, in the case of an off-property defect of the TFTs 104, i.e., a resistant value not sufficiently increased when the operation is turned off, a leakage defect on the photoconductive film 107, or a defect of extraordinally high sensitivity on the photoconductive film 107, even when the gate electrodes 102 are in a non-selection period, unnecessary electrical charge keeps leaking from the pixel to the data electrodes 103. Thus, the data electrodes 103 connected to the pixel are recognized as a line defect.

Generally, when a pickup image is displayed based on image data captured by the flat-panel image sensor 100, a line defect is more noticeable than a pixel defect (point defect), and it is difficult to correct the defect by image data processing.

Therefore, in the event of a pixel defect causing the above line defect, it is desirable to make correction on the pixel.

However, the conventional active-matrix substrate, the conventional two-dimensional image detector having the same, and the conventional method of correcting a pixel defect in the two-dimensional image detector do not refer to a method of correcting such a pixel defect.

SUMMARY OF THE INVENTION

The main objective of the present invention is to provide an active-matrix substrate which can readily suppress leakage of unnecessary electrical charge from a pixel defect, which may cause a line defect.

In order to attain the above objective, the active-matrix substrate of the present invention includes a pixel defect correcting part on a part of an electrode for connecting data electrodes and a pixel electrode, which is connected to the data electrodes via switching elements disposed respectively at intersections of gate electrodes and the data electrodes arranged in a lattice form.

Namely, the active-matrix substrate is provided with electrode wires having the gate electrodes such as scanning lines and the data electrodes such as signal lines arranged in a lattice form, the switching elements such as thin-film transistors (TFT) disposed respectively at intersections of the lattice form, the pixel electrode connected to the data electrodes via the switching elements, and storage capacitors connected to the pixel electrode.

Therefore, when the active-matrix substrate is used as a display device, the gate electrode is selected as the corresponding scanning line and a gate voltage is applied to the switching element such as the thin-film transistor (TFT) connected to the corresponding pixel electrode, so that an information signal is applied to the pixel electrode from the data electrode such as a signal line, and electrical charge is accumulated in the storage capacitor so as to display the pixel.

Meanwhile, in the case of the active-matrix substrate used as the flat-panel image sensor, when radiation such as an X-ray is emitted from the outside to the corresponding pixel, electrical charge is accumulated in the storage capacitor via the photoconductive film. Hence, the gate electrode is selected as the corresponding scanning line and a gate voltage is applied to the switching element such as the thin-film transistor connected to the pixel electrode of the corresponding pixel, so that an information signal based on electrical charge accumulated in the storage capacitor is applied to the data electrode such as a signal line via the pixel electrode, and the information signal is outputted to the outside.

In the present invention, a pixel defect correcting part is provided on a part of the electrode connecting the data electrode and the pixel electrode. Here, the "pixel defect correcting part" refers to a part which is cut by laser to correct a pixel defect.

Hence, the pixel defect correcting part is subjected to spot radiation of laser from the back of the active-matrix substrate so as to readily cut the pixel defect correcting part.

With this arrangement, for example, in a two-dimensional image detector, etc. including the photoconductive layer on the active-matrix substrate, it is possible to prevent unnecessary electrical charge caused by a pixel defect from leaking to the data electrode through the switching element.

Consequently, a defect recognized as a line defect before correction is corrected to a pixel defect (point defect) on a single pixel, so that the defect becomes more unnoticeable. Furthermore, a defect can be readily corrected by image data processing.

Thus, it is possible to provide the active-matrix substrate which can readily suppress leakage of unnecessary electrical charge from a pixel defect, which may cause a line defect.

For a fuller understanding of the nature and advantages of the invention, reference should be made to the ensuing detailed description taken in conjunction with the accompanying drawings.

DESCRIPTION OF THE EMBODIMENTS

EMBODIMENT 1

Referring to FIGS. 1 to 6, and 17(a) to 17(e), the following describes one embodiment of the present invention.

A flat-panel image sensor acting as a two-dimensional image detector of the present embodiment is used in a device such as an X-ray pickup device for forming an X-ray image passing through a human body, and the image sensor detects an image of an X-ray, etc. Here, the two-dimensional image detector of the present invention is not particularly limited to a flat panel. It is also possible to adopt an image sensor composed of a curved substrate, which includes a curved surface.

Figure 2:
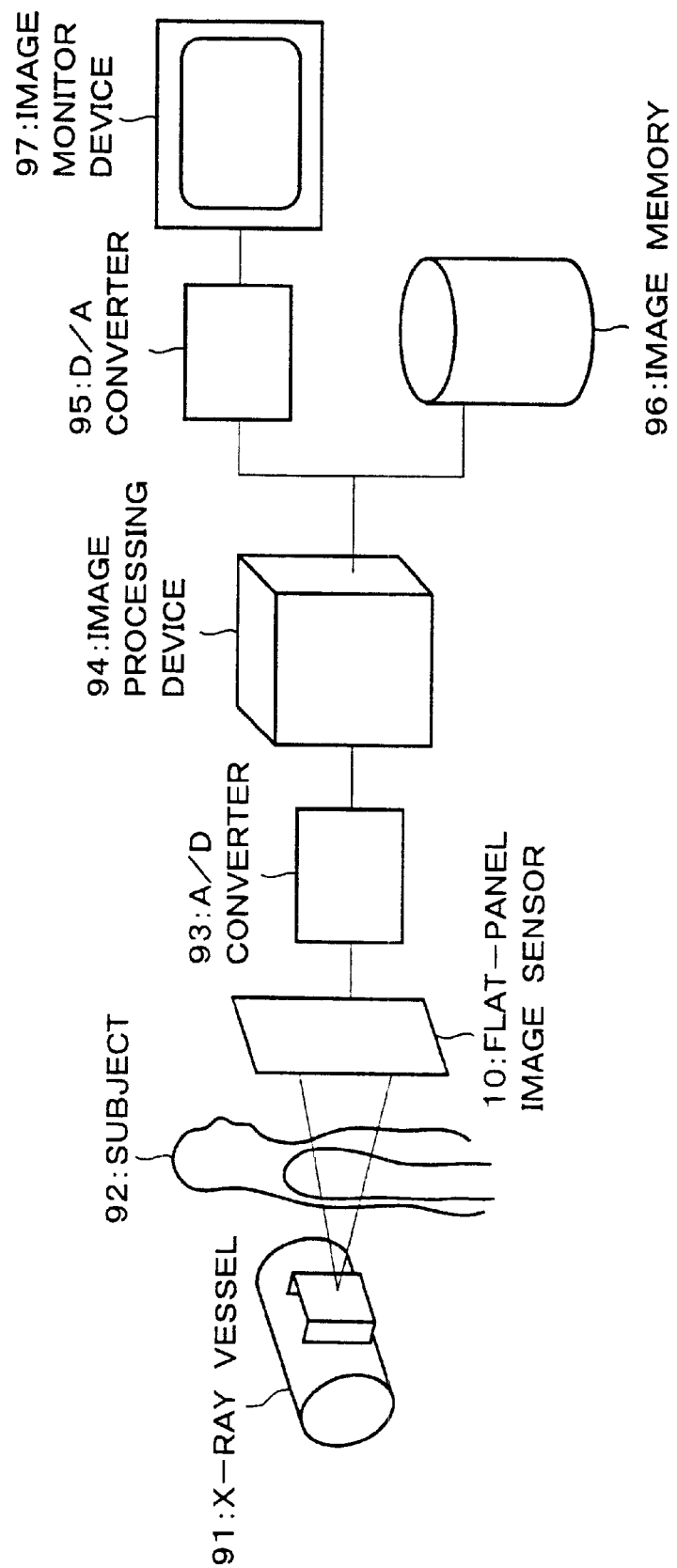
FIG. 2 is a block diagram showing application of the flat-panel image sensor.

Namely, as shown in FIG. 2, a transmitting X-ray image of a subject 92, that is composed of an X-ray emitted from an X-ray vessel 91, is converted to an image signal by a flat-panel image sensor 10 of the present embodiment, in which optoelectronic transducing elements are disposed in two-dimensional arrays.

An analog signal outputted from the flat-panel image sensor 10 is converted to a digital image signal by an A/D converter 93 and is taken into an image processing device 94. The image processing device 94 performs a variety of image processings and makes an image memory 96 store images to be stored. Further, a digital image signal outputted from the image processing device 94 is converted to an analog signal by a D/A converter 95 and is displayed on a screen of an image monitor 97.

Figure 3:
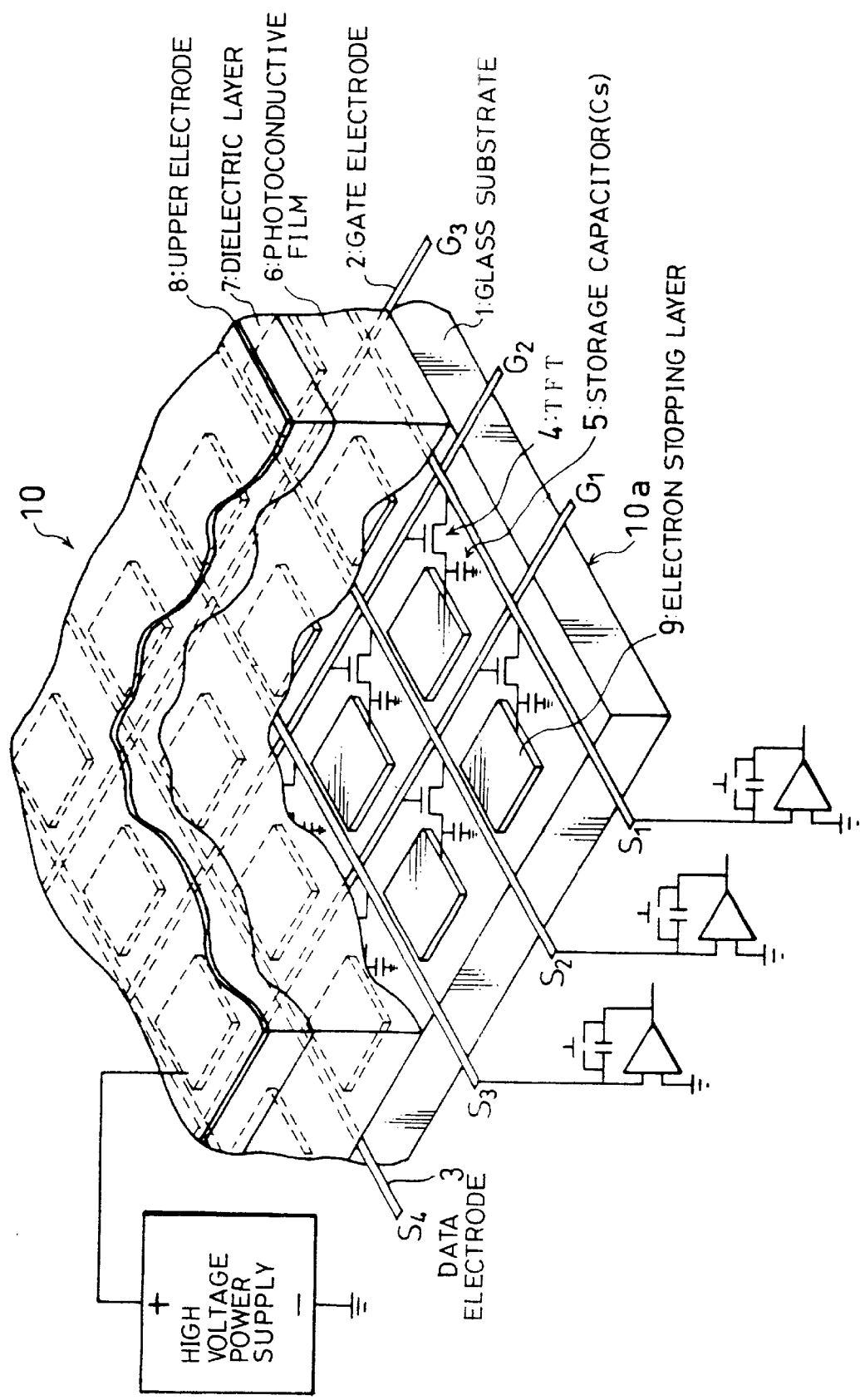
FIG. 3 is a perspective view showing a cutaway view of the construction of the flat-panel image sensor.
Figure 4:
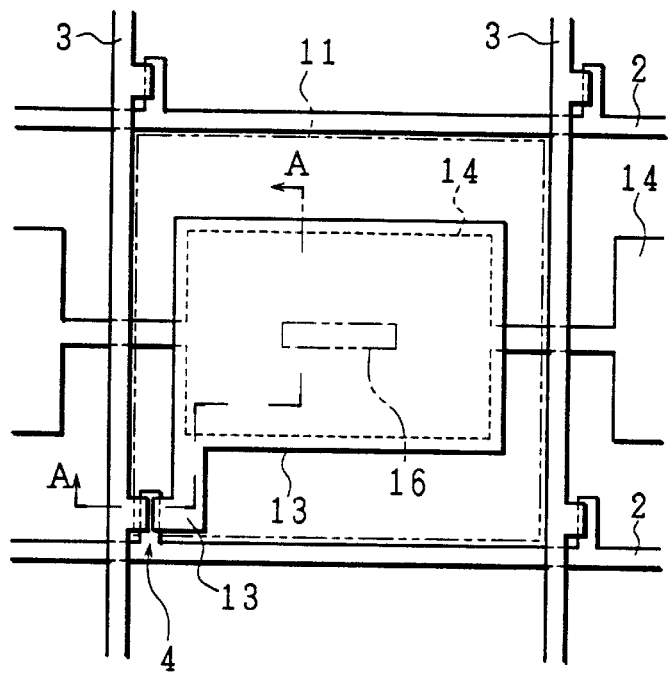
FIG. 4(a) is a plan view showing the construction of one pixel of the active-matrix substrate.
FIG. 4(b) is a sectional view taken along line A—A shown in FIG. 4(a).
Figure 4:
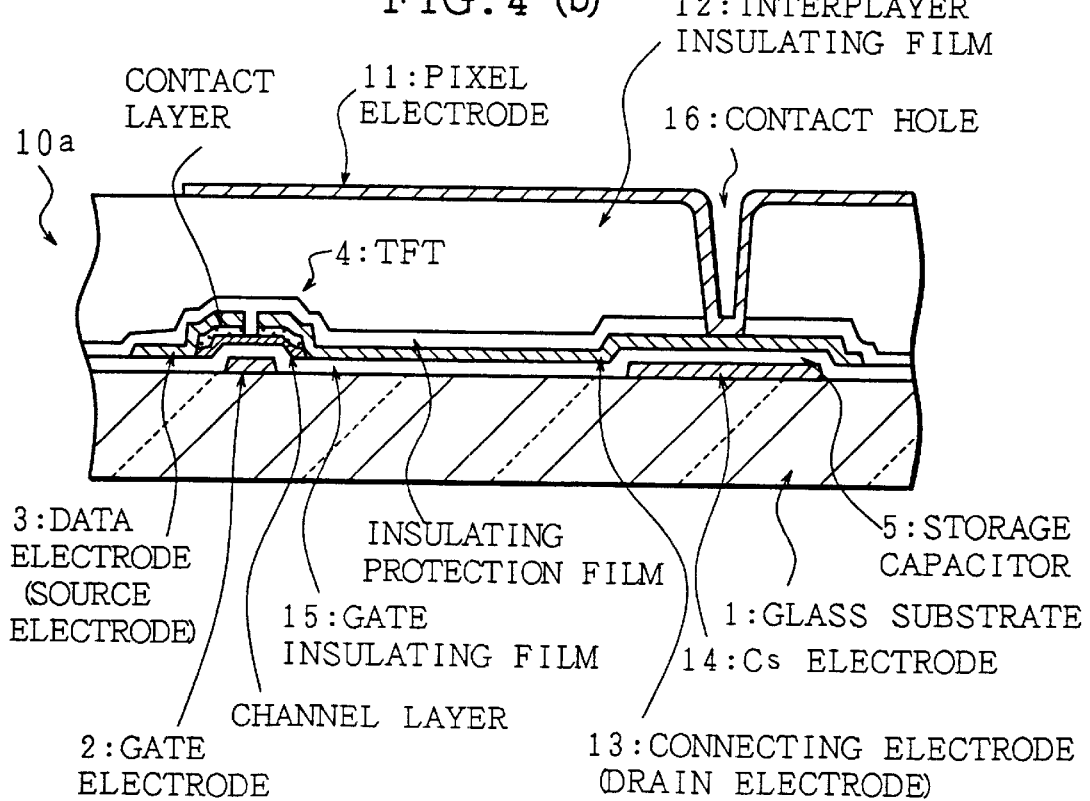

Here, as shown in FIG. 3, the flat-panel image sensor 10 of the present embodiment is constituted by an active-matrix substrate 10a, a photoconductive film 6 serving as a photoconductive layer formed on substantially an entire surface of the active-matrix substrate 10a, a dielectric layer 7, an upper electrode 8, and an electron stopping layer 9 formed on a pixel electrode 11 (described later).

The photoconductive film 6 is made of a semiconducting material which generates electrical charge (electron-hole pair) by receiving radiation such as an X-ray. As a semiconducting material, it is possible to adopt an amorphous selenium (a-Se), which has a high dark resistance and a photoconductive property preferable to X-ray radiation, and forms a large film with ease by deposition. The photoconductive film 6 is formed with a thickness of 300 to 1000 $\mu$m by vacuum deposition.

Moreover, the dielectric layer 7 and the electron stopping layer 9 are provided for preventing leakage current from accumulating electrical charge in a storage capacitor 5. These layers are provided if necessary.

In other words, when an operation voltage is applied to the upper electrode 8, the dielectric layer 7 prevents electrical charge from passing through the upper electrode 8 to the photoconductive film 6, and the electron stopping layer 9 prevents electrical charge from passing through the pixel electrode 11 to the photoconductive film 6. With this arrangement, leakage current can be prevented so as to improve S/N of an X-ray image.

Meanwhile, the active-matrix substrate 10a is provided with a glass substrate 1, gate electrodes 2 of electrode wires, data electrodes 3 serving as source electrodes of electrode wires, which are arranged in a lattice form on the glass substrate 1, thin-film transistors (TFT: Thin Film Transistor) which are provided as switching elements respectively at intersections of the lattice form, a pixel electrode 11 connected via the thin-film transistor 4 to the data electrodes 3, and a storage capacitor (Cs) 5 connected in series with the pixel electrode 11.

In the present embodiment, as shown in FIGS. 4(a) to 4(b), the pixel electrode 11 is disposed above the gate electrodes 2 and the data electrodes 3 that are electrode wires arranged in a lattice form and an interlayer insulating film 12 formed on an upper layer of the thin-film transistor 4, namely, on the highest layer of the active-matrix substrate 10a; meanwhile, the pixel electrode 11 and the thin-film transistor 4 are connected with each other via a connecting electrode 13 acting as a drain electrode.

Also, the storage capacitor 5 is made up of an overlapping area of an storage capacitor electrode (hereinafter, referred to as a "Cs electrode") 14 and the connecting electrode 13. The storage capacitor electrode 14 is formed on the same layer as the gate electrode 2. A gate insulating film 15 between the connecting electrode 13 and the storage capacitor electrode 14 acts as a dielectric layer of the storage capacitor 5.

Besides, as earlier mentioned, a source and a drain of the thin-film transistor 4 are respectively connected to the data electrode 3 and the connecting electrode 13.

On substantially the entire surface of the active-matrix substrate 10a, the photoconductive film 6, which is made of the a-Se and acts as a photoconductive layer, the dielectric layer 7, and the upper electrode 8 acting as a bias electrode are stacked in this order so as to form the flat-panel image sensor 10.

Here, as for the active-matrix substrate 10a, it is possible to adopt an active-matrix substrate formed in a manufacturing step of a liquid crystal display device. For example, an active-matrix substrate used in an active-matrix liquid crystal display device (AMLCD) is provided with thin-film transistors (TFT) made of amorphous silicon (a-Si) and polysilicon (p-Si), XY matrix electrodes, and storage capacitors (Cs). If only some changes are made in arrangement, this active-matrix substrate can be readily used as the active-matrix substrate 10a for the flat-panel image sensor 10.

Next, the following discusses an operation principle of the flat-panel image sensor 10 having the above construction.

As shown in FIG. 3, when radiation is emitted to the photoconductive film 6 composed of an a-Se film, electrical charge (electron-hole pair) is generated in the photoconductive film 6. And then, the photoconductive film 6 and the storage capacitors 5 are electrically connected in series. Thus, when a voltage is applied between the upper electrode 8 and the Cs electrode 14, electrical charge (electron-hole pair) generated in the photoconductive film 6 is shifted to a positive electrode side and a negative electrode side. Consequently, the storage capacitors 5 accumulate electrical charge. Here, the electron stopping layer 9 is formed between the photoconductive film 6 and the storage capacitor 5, and the dielectric layer 7 is formed between the upper electrode 8 and the photoconductive film 6. Hence, the electron stopping layer 9 and the dielectric layer 7 prevent the entry of electrical charge from one side, thereby preventing leakage current.

With the above effect, the electrical charge accumulated in the storage capacitor 5 can be taken out from data electrodes S1, S2, S3, . . . , Sn by turning on the thin-film transistor 4 by input signals of gate electrodes G1, G2, G3, . . . , Gn.

Moreover, the electrode wires having the gate electrodes 2 and the data electrodes 3, the thin-film transistors 4, and the storage capacitors 5 are all arranged in an XY matrix form. Hence, signals inputted to the gate electrodes G1, G2, G3, . . . , Gn are successively scanned for each line so as to acquire X-ray image information in a two-dimensional manner. Consequently, as earlier mentioned, the image can be monitored by using the image monitor device 97 and so on.

Additionally, when the used photoconductive film 6 shows photoconductivity to visible light and infrared light as well as radiation such as an X-ray, the flat-panel image sensor 10 also acts as a flat-panel image sensor for visible light and infrared light. For instance, the photoconductive film 6 made of a-Se shows favorable photoconductivity to visible light, so that the development is underway of a high-sensitivity image sensor using an avalanche effect obtained by applying an electric field.

Incidentally, as shown in FIGS. 4(a) and 4(b), when the flat-panel image sensor 10 has an off-property defect on the thin-film transistor 4, a leakage defect on the photoconductive film 6 made of a-Se, or a defect of extraordinally high sensitivity on the photoconductive film 6 made of a-Se, unnecessary electrical charge keeps leaking to the data electrodes 3 in the pixel regardless of whether the gate electrodes 2 are selected or not, so that the data electrodes 3 connected to the pixel are recognized as a line defect. Normally, when a pickup image is displayed based on image data captured by the flat-panel image sensor 10, a line defect is more noticeable than a pixel defect (point defect). Further, it is difficult to correct a defect by image data processing.

Thus, in the present embodiment, the connecting electrode 13 is formed as a pixel defect correcting part with a long length to readily make cuts with laser radiation. Moreover, the pixel defect correcting part is a thin part of the connecting electrode 13. Namely, parts other than the connecting electrode 13, e.g., the pixel electrode 11 and the thin-film transistors 4 are not cut by spot radiation of laser.

Figure 1:
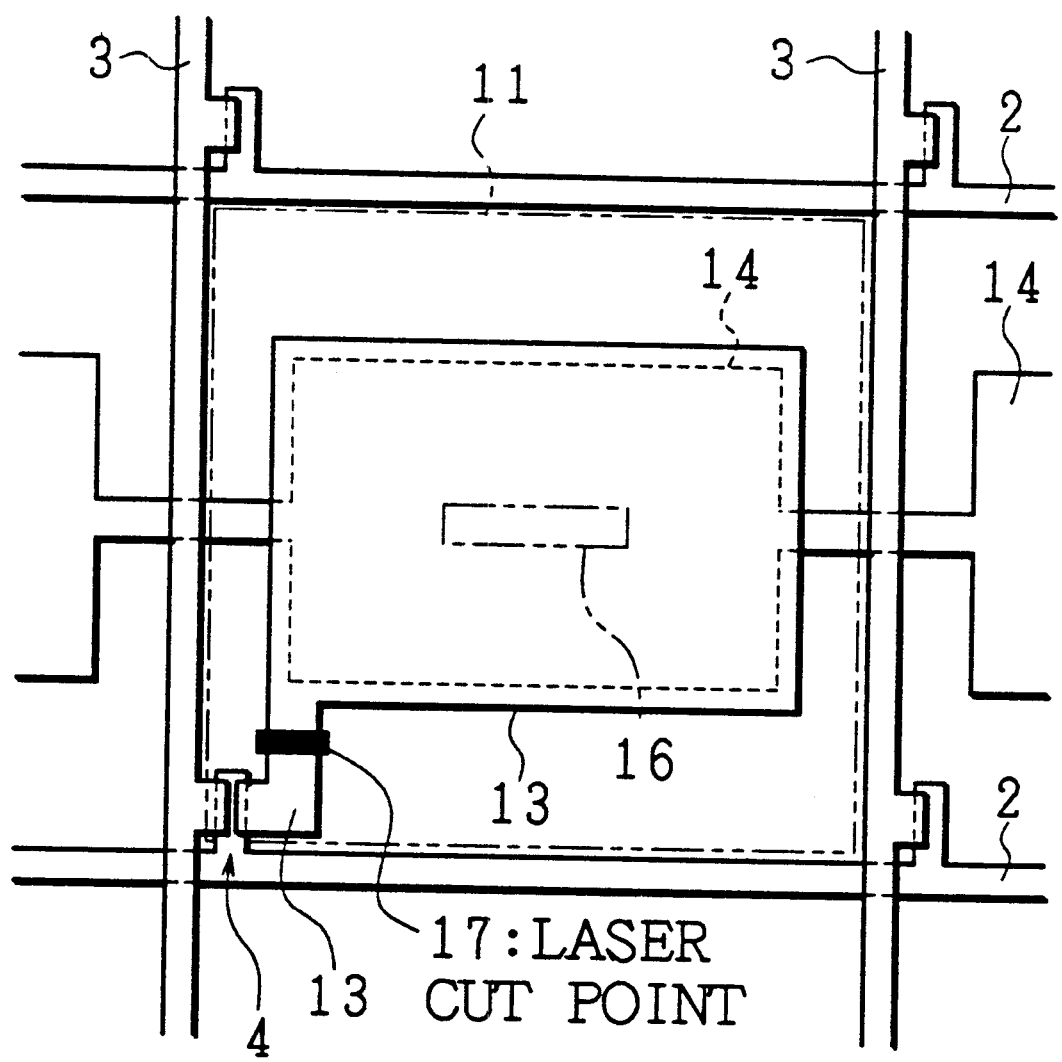
FIG. 1 is a plan view showing one embodiment of an active-matrix substrate and a flat-panel image sensor according to the present invention and a laser cut point on a pixel defect correcting part.

With this arrangement, as shown by a solid line of FIG. 1, according to a method with which a laser cut point 17 on the connecting electrode 13 is subjected to spot radiation of YAG (Yttrium Aluminium Garnet: $Y_3Al_5O_{12}$) laser from the back of the active-matrix substrate 10a through the glass substrate 1, which is a base of the active-matrix substrate 10a, the connecting electrode 13 can be readily cut and corrected. Therefore, the "pixel defect correcting part" of the present embodiment indicates a part which is cut by laser, etc. so as to readily correct a pixel defect.

As a result, it is possible to prevent electrical charge from leaking through the thin-film transistors 4 to the data electrodes 3, the electrical charge being generated in the photoconductive film 6 or being caused by a defect on the photoconductive film 6.

According to an experiment, it is confirmed that a defect recognized as a line defect before correction is corrected to a pixel defect (point defect) on a single pixel, so that the defect becomes more unnoticeable. Furthermore, it is also confirmed that defect correction can be readily made by image data processing.

Here, the active-matrix substrate 10a includes the interlayer insulating film 12 made of an organic material such as acrylic and polyimide between the connecting electrode 13 as a pixel defect correcting part and a layer having the pixel electrode 11. The pixel electrode 11 and the connecting electrode 13 are connected to each other via a contact hole 16 penetrating the interlayer insulating film 12.

Hence, even when the pixel defect correcting part is subjected to spot radiation of laser to cut a pixel defect correcting part, it is possible to minimize the influence of the radiation on a surface of the active-matrix substrate 10a, i.e., the highest layer of the active-matrix substrate 10a. Moreover, it is also possible to minimize the influence on films formed on the active-matrix substrate 10a.

For example, in the case of a flat-panel image sensor including the photoconductive film 6 on the active matrix substrate, which does not include the interlayer insulating film 12, when a pixel defect correcting part is subjected to spot radiation of laser, the pixel defect correcting part is cut by laser energy and physical influence is accordingly exerted on the photoconductive film 6 on the active-matrix substrate, resulting in exfoliation and a property change on the photoconductive film 6.

However, like the active-matrix substrate 10a of the present embodiment, when the interlayer insulating film 12 made of an organic material is formed on a layer including a pixel defect correcting part, the damage on the photoconductive film 6 can be reduced by the insulating film 12. Thus, this arrangement is effective.

Figure 5:
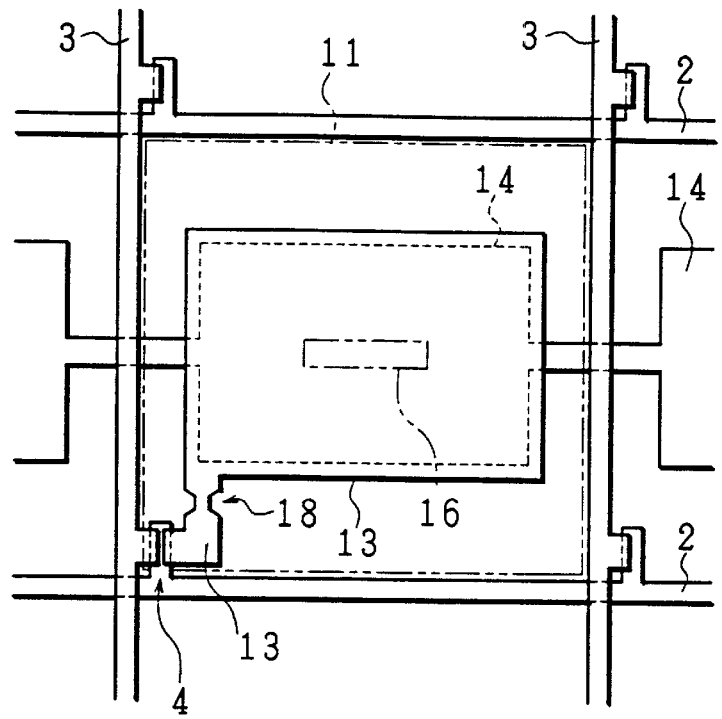
FIG. 5 is a plan view showing the active-matrix substrate including a restriction on the pixel defect correcting part.
Figure 17:
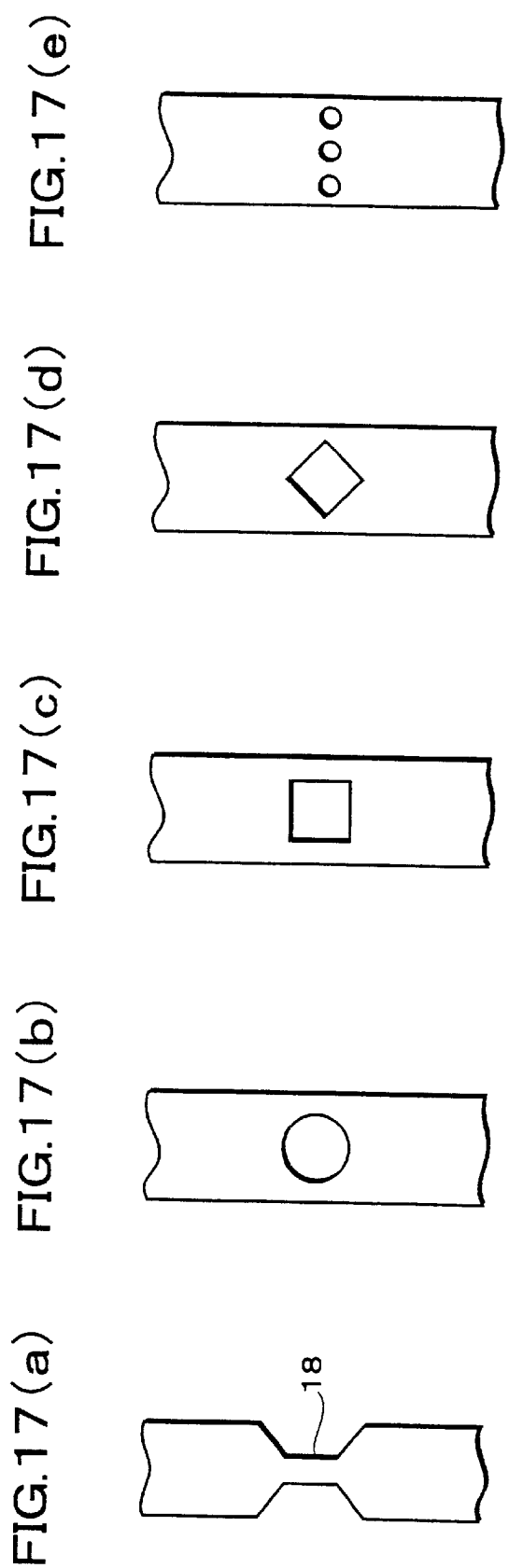
FIGS. 17(a) to 17(e) are plan views showing examples of a shape of the pixel defect correcting part of the active-matrix substrate shown in FIG. 1.
Figure 18:
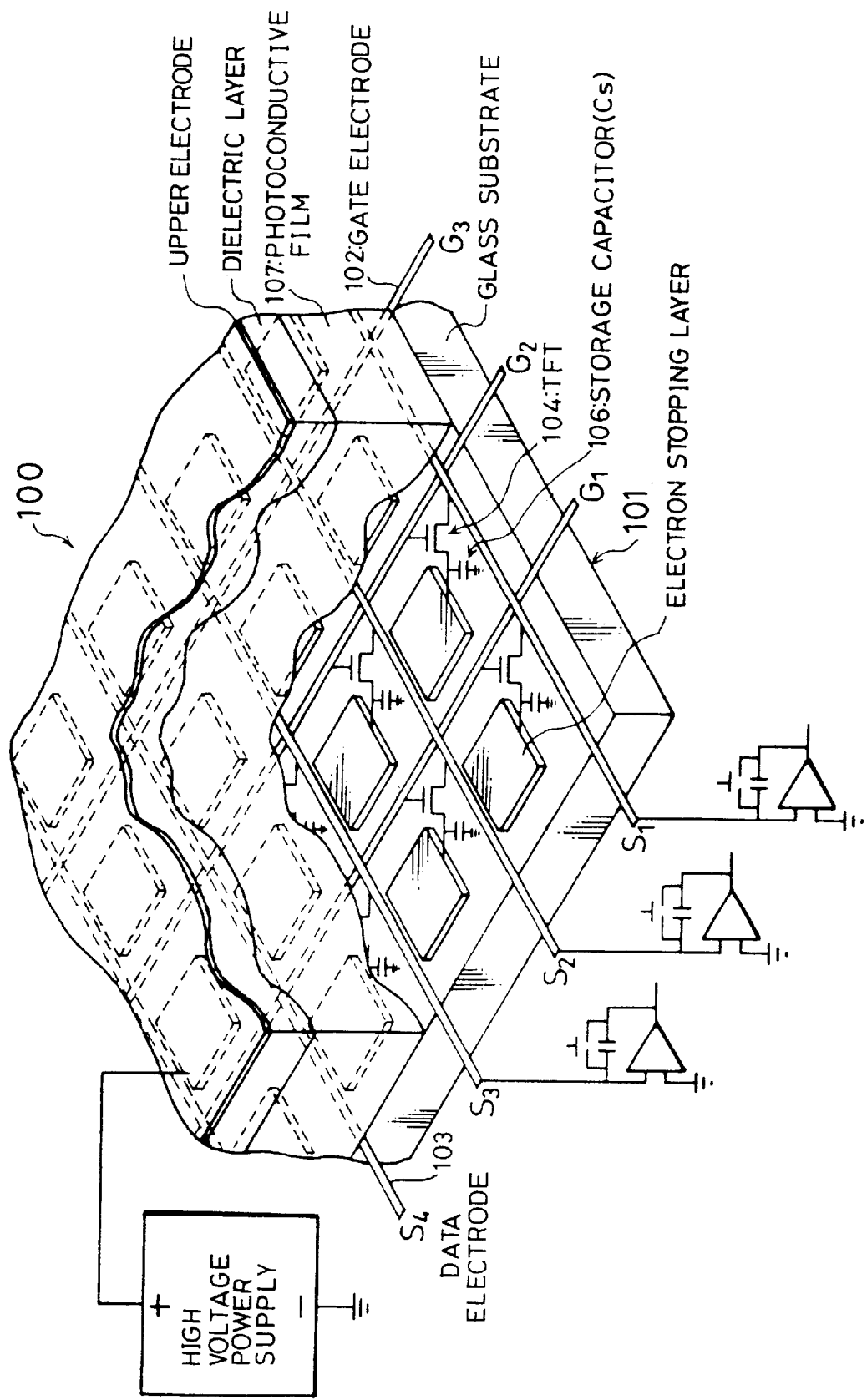
FIG. 18 is a perspective view showing a cutaway view of the construction of a conventional active-matrix substrate and flat-panel image sensor.
Figure 19:
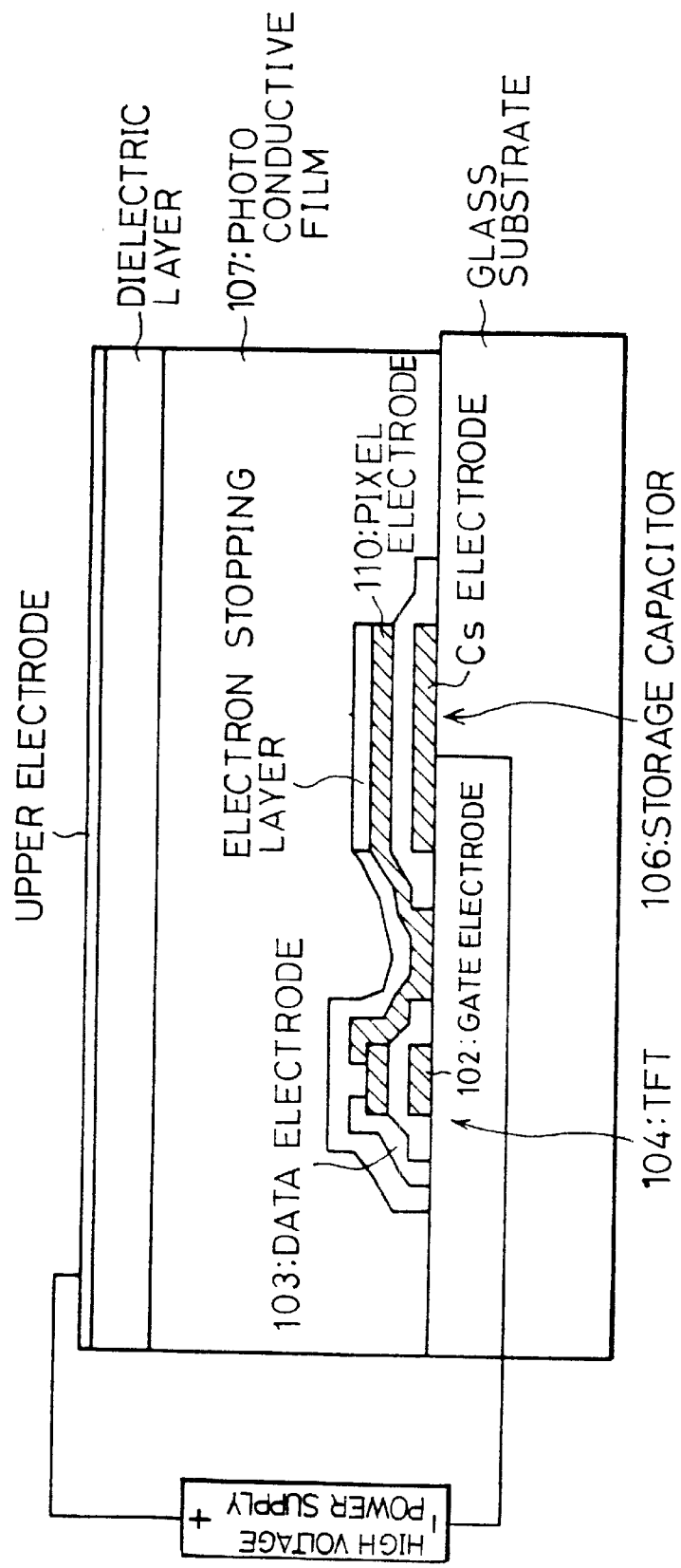
FIG. 19 is a sectional view showing the construction of the conventional active-matrix substrate and flat-panel image sensor.

Here, as shown in FIGS. 5 and 17(a), a pixel defect correcting part of the connecting electrode 13 is formed into a restriction 18 so as to be identified at a glance as a pixel defect correcting part to be cut by laser radiation. Further, the electrode is thin at the restriction 18, so that the electrode can be readily cut by laser radiation and correction can be positively made in a simple manner. Here, the shape of the pixel defect correcting part is not limited to a restriction. For example, as shown in FIGS. 17(b) to 17(e), the connecting electrode 13 only needs to be thinner than surrounding parts by forming a chipped part on the electrode. Namely, as long as the electrode such as the connecting electrode 13 is easy to cut with laser radiation and correction can be positively made in a simple manner, any shape is applicable to the pixel defect correcting part.

Figure 6:
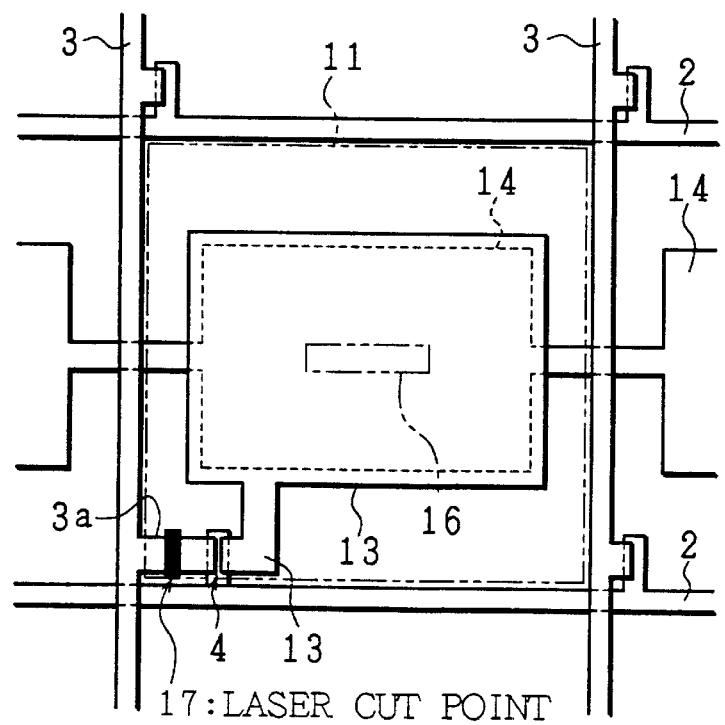
FIG. 6 is a plan view showing the active-matrix substrate including the pixel defect correcting part on a connecting part between the data electrode and a thin-film transistor.

Meanwhile, the position of the pixel defect correcting part is not limited to the connecting electrode 13 connecting the thin-film transistor 4 and the pixel electrode 11. For example, as shown in FIG. 6, a connecting part 3a connecting the thin-film transistor 4 and the data electrode 3 is also available. In this case, the connecting part 3a is longer than that of an ordinary arrangement to prevent influence of laser radiation on other parts.

In other words, in order to prevent unnecessary leakage of electrical charge from the pixel electrode 11 to the data electrode 3, it is effective to cut a part of a conducting path between the data electrode 3 and the pixel electrode 11. Additionally, in FIG. 6 as well, it is useful to reduce a thickness of the pixel defect correcting part by forming the pixel defect correcting part, which is subjected to laser cut, into a restriction.

As earlier mentioned, the active-matrix substrate 10a and the flat-panel image sensor 10 of the present embodiment include a) the electrode wires having the gate electrodes 2 acting as scanning lines and the data electrodes 3 acting as signal lines arranged in a lattice form, b) the thin-film transistors 4 disposed respectively at intersections of the lattice form, c) the pixel electrodes 11 connected to the data electrodes 3 via the thin-film transistors 4, and d) storage capacitors 5 connected in series with the pixel electrodes 11.

Therefore, when the active-matrix substrate 10a is used as a display device, the gate electrode 2 is selected as the corresponding scanning line and a gate voltage is applied to the thin-film transistor 4 connected to the corresponding pixel electrode 11, so that an information signal is applied to the pixel electrode 11 from the data electrode 3 serving as a signal line, and electrical charge is accumulated in the storage capacitor 5 so as to display the pixel.

Meanwhile, in the case of the active-matrix substrate 10a used as the flat-panel image sensor 10, when radiation such as an X-ray is emitted from the outside to the corresponding pixel, electrical charge is accumulated in the storage capacitor 5 via the photoconductive film 6. Hence, the gate electrode 2 is selected as the corresponding scanning line and a gate voltage is applied to the thin-film transistor 4 connected to the pixel electrode 11 of the corresponding pixel, so that an information signal based on electrical charge accumulated in the storage capacitor 5 is applied to the data electrode 3 such as a signal line via the pixel electrode 11, and the information signal is outputted to the outside.

Here, in the present embodiment, a part of the electrode connecting the data electrode 3 and the pixel electrode 11 has the connecting electrode 13, which is a pixel defect correcting part for simple laser cutting. Thus, the connecting electrode 13 is subjected to spot radiation of laser from the back of the active-matrix substrate 10a so as to readily cut the connecting electrode 13.

With this arrangement, in the flat-panel image sensor 10 and so on including the photoconductive film 6 on the active-matrix substrate 10a, it is possible to prevent unnecessary electrical charge, which is caused by a pixel defect, from leaking to the data electrodes 3 through thin-film transistors 4.

Consequently, a defect recognized as a line defect before correction is corrected to a pixel defect (point defect) on a single pixel, so that the defect becomes more unnoticeable. Furthermore, a defect can be readily corrected by image data processing.

Therefore, it is possible to provide the active-matrix substrate 10a and the flat-panel image sensor 10 that can readily suppress leakage of unnecessary electrical charge from a pixel defect, which may cause a line defect.

Furthermore, in the active-matrix substrate 10a and the flat-panel image sensor 10 of the present embodiment, the connecting electrode 13 serving as a pixel defect correcting part is formed into a restriction, and the connecting electrode 13 has a restriction 18. Additionally, as shown in FIG. 6, when a pixel defect correcting part is provided on the connecting part 3a, an electrode on the connecting part 3a may be formed into a restriction. However, the electrode shape of a pixel defect correcting part is not limited to a restriction as long as the part is thinner than adjacent parts.

Therefore, it is possible to identify at a glance the connecting electrode 13 or the connecting part 3a to be cut by laser radiation. The electrode is thin at the restriction 18 so as to readily cut the electrode and to positively make correction.

As a result, it is possible to provide the active-matrix substrate 10a and the flat-panel image sensor 10 that can positively suppress leakage of unnecessary electrical charge with ease from a pixel defect, which may cause a line defect.

Further, in the active-matrix substrate 10a and the flat-panel image sensor 10, the interlayer insulating film 12 made of an organic material is formed between a layer including the pixel electrode 11 and a layer including the connecting electrode 13, and the pixel electrode 11 is connected to the layer including the connecting electrode 13 via the contact hole 16 formed in the interlayer insulating film 12.

Accordingly, the connecting electrode 13 is subjected to spot radiation of laser, so that the influence of damage can be minimized on the highest layer of a surface of the active-matrix substrate 10a even when the connecting electrode 13 is cut. Hence, it is possible to minimize the influence exerted on films formed on the active-matrix substrate 10a.

For instance, in the case of the flat-panel image sensor 10 including the photoconductive film 6 on the active-matrix substrate 10a, when the connecting electrode 13 is subjected to spot radiation of laser, the connecting electrode 13 is cut by laser energy and physical influence is accordingly exerted on the photoconductive film 6 on the active-matrix substrate 10a, thereby causing exfoliation, a property change, etc. on the photoconductive film 6.

However, when the interlayer insulating film 12 made of an organic material is provided on the layer including the connecting electrode 13, the damage on the photoconductive film 6 is reduced by the interlayer insulating film 12.

Consequently, it is possible to provide the active-matrix substrate 10a and the flat-panel image sensor 10 that can efficiently suppress leakage of unnecessary electrical charge from a pixel defect, which may cause a line defect.

Additionally, in the active-matrix substrate 10a and the flat-panel image sensor 10 of the present embodiment, the pixel electrode 11 is formed on the interlayer insulating film 12, which is made of an organic material and is formed on the electrode wires arranged in a lattice form and the thin-film transistor 4.

Accordingly, it is possible to adopt the interlayer insulating film 12 made of an organic material with a relatively small relative dielectric constant of about 3. The interlayer insulating film 12 can be formed with a thickness of the order of $\mu$m by spin coating and laminating. For this reason, it is possible to reduce parasitic capacity appearing between the pixel electrode 11 and the electrode wires arranged in a lattice form, and parasitic capacity appearing between the pixel electrode 11 and the thin-film transistor 4.

Therefore, the pixel electrode 11 can be disposed so as to overlap the electrode wires formed into a lattice form and the thin-film transistor 4, thereby increasing a degree of freedom on design.

Consequently, it is possible to provide the active-matrix substrate 10a and the flat-panel image sensor 10 that can readily and positively suppress leakage of unnecessary electrical charge from a pixel defect, which may cause a line defect.

Besides, in the flat-panel image sensor 10 of the present embodiment, the photoconductive film 6 is composed of a semiconductor layer whose main component is selenium (Se) such as a-Se.

Namely, for example, a semiconductor layer whose main component is selenium (Se) such as a-Se can be formed into a film by vacuum deposition at low temperature (room temperature). Hence, the semiconductor layer can be directly formed into a film on the active-matrix substrate 10a.

Consequently, it is possible to readily provide the flat-panel image sensor 10 being able to readily and positively suppress leakage of unnecessary electrical charge from a pixel defect, which may cause a line defect.

Here, in the case of the semiconductor layer whose main component is selenium (Se) such as a-Se, it has been known that crystallization is accelerated at 60 to 80° C. or more, resulting in degradation in property. Further, a thermal expansion coefficient thereof is larger than that of a glass substrate. Thus, when the active-matrix substrate 10a of the flat-panel image sensor 10 is corrected with laser, the semiconductor layer whose main component is selenium (Se) such as a-Se is susceptible to damage.

In response, as will be described in Embodiment 2, an active-matrix substrate 20a is adopted which includes a connecting electrode 13 disposed substantially at the center of the pixel electrode 11, so that the damage caused by a semiconductor layer, whose main component is selenium (Se) such as a-Se, can be minimized on an adjacent pixel even when laser correction is made.

Besides, in the pixel defect correcting method regarding the flat-panel image sensor 10 of the present embodiment, when a pixel defect is corrected in the flat-panel image sensor 10, the connecting electrode 13 is cut with laser radiation. The connecting electrode 13 can be readily cut with laser radiation and is disposed on a part of an electrode connecting the data electrode 3 and the pixel electrode 11.

This arrangement makes it possible to prevent unnecessary electrical charge caused by a pixel defect from leaking to the data electrode 3 via the thin-film transistor 4.

Consequently, a defect recognized as a line defect before correction is corrected to a pixel defect (point defect) on a single pixel, so that the defect becomes more unnoticeable. Furthermore, defect correction can be readily made by image data processing.

Therefore, it is possible to provide a pixel defect correcting method of the flat-panel image sensor 10, that can readily suppress leakage of unnecessary electrical charge from a pixel defect, which may cause a line defect.

EMBODIMENT 2

Referring to FIGS. 7 to 11, the following discusses another embodiment of the present invention. Here, for convenience of explanation, those members that have the same functions and that are described in the figures of Embodiment 1 are indicated by the same reference numerals and the description thereof is omitted.

It is confirmed that the pixel defect correcting method of Embodiment 1 can suppress leakage of unnecessary electrical charge from a pixel defect, which may cause a line defect. However, under some conditions of correcting a pixel defect, another problem occurs as follows.

Namely, as shown in FIG. 3, the foregoing flat-panel image sensor 10 has a construction in which the photoconductive film 6 made of a-Se is directly formed on a surface of the active-matrix substrate 10a. Hence, when a pixel defect correcting part is subjected to spot radiation of YAG laser from the back of the glass substrate 1, if a spot diameter is too large and intensity of the YAG laser is too high, the photoconductive film 6 made of a-Se sustains the damage.

To be specific, exfoliation and a property change in a-Se are found on the photoconductive film 6 mainly around a laser radiation spot. This is because the photoconductive film 6 and the glass substrate 1 considerably differ in thermal expansion coefficient and because crystallization is accelerated and a-Se is prone to degradation in property at 60 to 80° C. or more.

Incidentally, even if the conductive film 6 made of a-Se is damaged, as long as the damage is confined within a single pixel as a target of pixel defect correction, any problem does not occur because the pixel has been originally defective.

Figure 7:
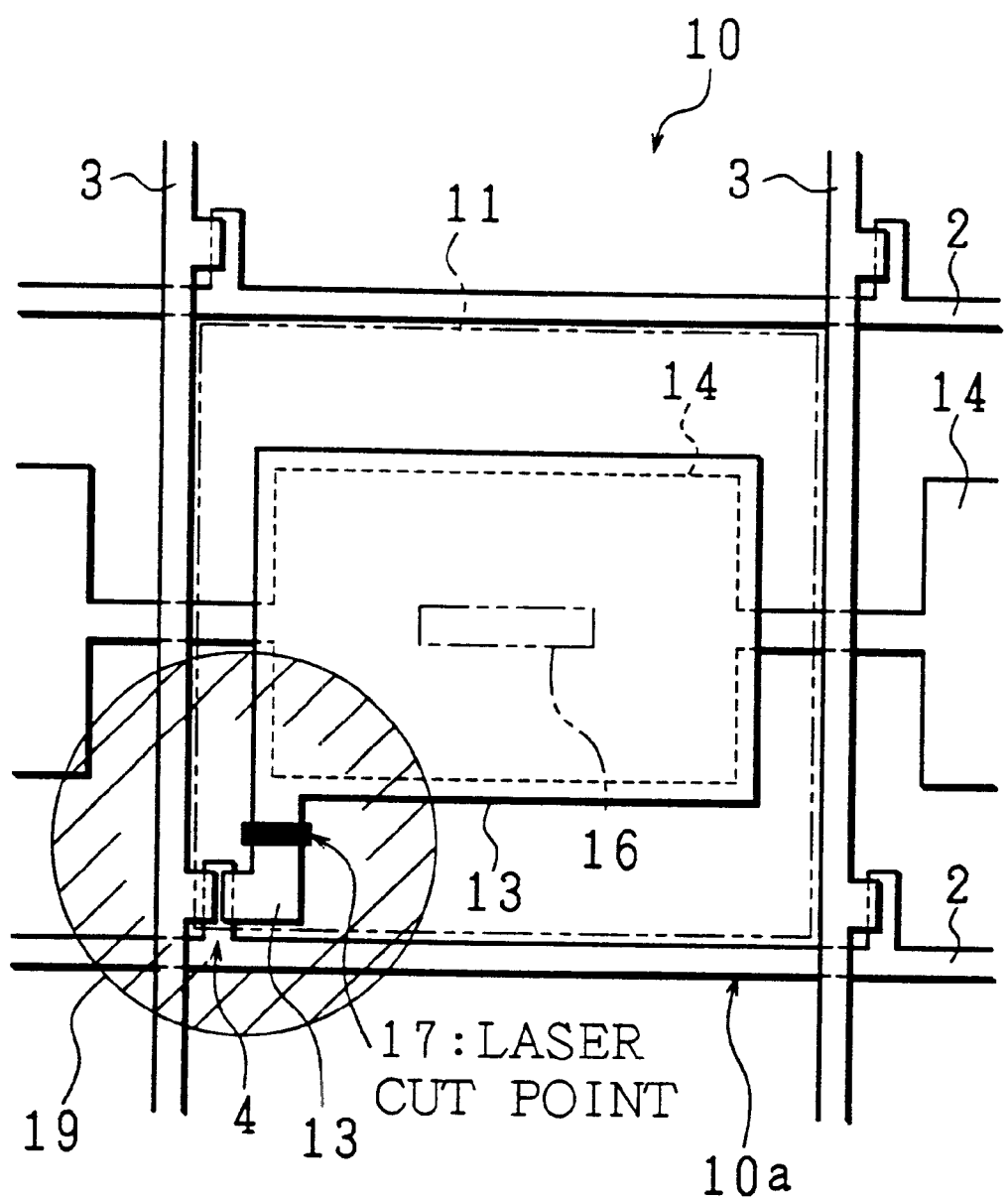
FIG. 7 is a plan view showing a damaged area on a photoconductive film when the pixel defect correcting part is cut on the active-matrix substrate shown in FIGS. 4(a) and 4(b).

However, as shown in FIG. 7, damage may spread to surrounding pixel areas under some conditions of correcting a pixel defect. According to the experience of the inventor et al., the laser cut point 17, which is indicated by a solid line in FIG. 7, is subjected to YAG laser radiation. Thus, as shown by a diagonally shaded circle in FIG. 7, a damage area 19 is confirmed, in which the photoconductive film 6 is prone to damage by laser radiation with a diameter of about 100 µm. The laser cut point 17 is positioned at a center of the damage area 19.

When a pixel is 150 µm×150 µm in size in the flat-panel image sensor 10, if a pixel defect correcting part is at a corner of the pixel, as shown in FIG. 7, the damage area 19 clearly spreads to surrounding pixel areas, resulting in a defect on an adjacent pixel.

Therefore, in the present embodiment, the layout of the active-matrix substrate 10a described in Embodiment 1 is changed so as to solve the above problem.

Figure 8:
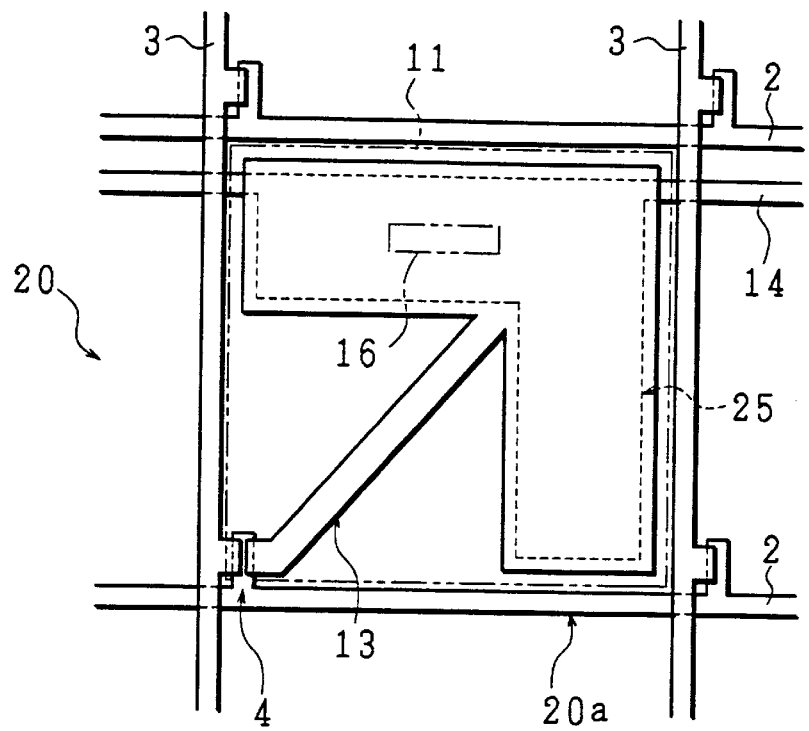
FIG. 8 is a plan view showing another embodiment of the active-matrix substrate and the flat-panel image sensor according to the present invention, in which a storage capacitor is partially disposed on a rectangular area composed of electrode wires arranged in a lattice form so as to dispose a pixel defect correcting part substantially at the center of a pixel electrode.

Namely, as shown in FIG. 8, an active-matrix substrate 20a used for the flat-panel image sensor 20 of the present embodiment is characterized in that a storage capacitor 25 is partially disposed in a rectangular area composed of electrode wires having gate electrodes 2 and data electrodes 3 arranged in a lattice form, so that a connecting electrode 13 is disposed as a pixel defect correcting part on an area substantially at the center of the pixel electrode 11.

The connecting electrode 13 is formed so as to extend from a thin-film transistor 4 to the center of the pixel electrode 11.

Furthermore, the storage capacitor 25 includes a Cs electrode 14 formed into an L shape directly under the pixel electrode 11, so that the storage capacitor 25 is partially formed on the rectangular pixel electrode 11. Here, in the present embodiment, the Cs electrode 14 is formed into an L shape. However, the shape of the Cs electrode 14 is not particularly limited. Other shapes are also applicable to partially dispose the storage capacitor 25.

Figure 9:
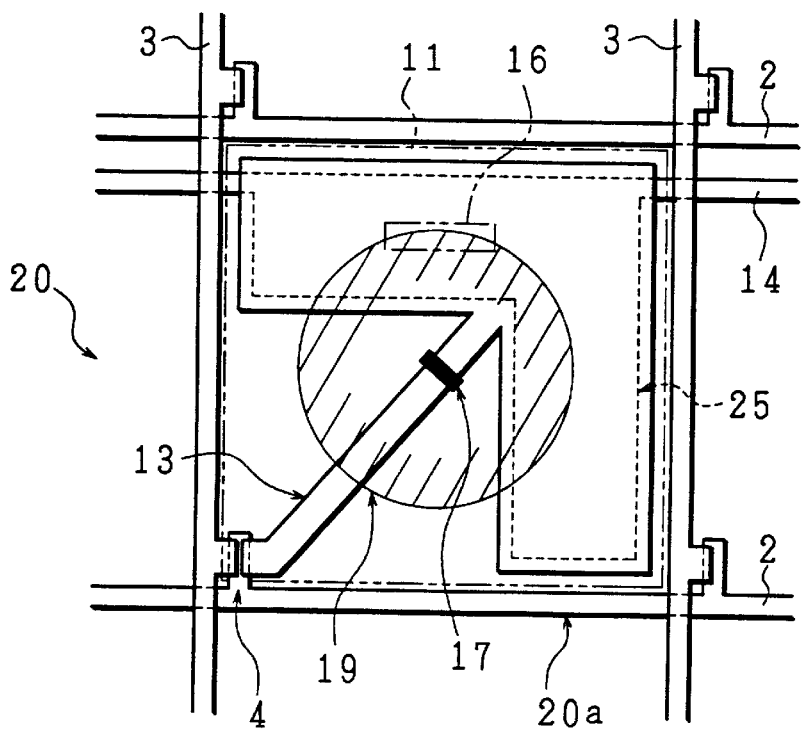
FIG. 9 is a plan view showing a damaged area on the photoconductive film when the pixel defect correcting part is cut by laser on the active-matrix substrate shown in FIG. 8.

Besides, when a defect appears on the pixel, as shown by a solid line in FIG. 9, a laser cut point 17 on the connecting electrode 13 is subjected to spot radiation of YAG laser from the back of the active-matrix substrate 20a through a glass substrate 1, which is a base of the active-matrix substrate 20a, so that the connecting electrode 13 is cut and correction is made.

With this arrangement, electrical charge generated in a photoconductive film 6 made of a-Se or electrical charge caused by a defect on the photoconductive film 6 can be prevented from leaking to the data electrode 3 via the thin-film transistor 4. Consequently, it is confirmed that a defect recognized as a line defect before correction is corrected to a pixel defect (point defect) on a single pixel, so that the defect becomes more unnoticeable. Furthermore, it is confirmed that defect correction can be readily made by image data processing.

Moreover, in the present embodiment, as shown in FIG. 9, it is confirmed that the damage area 19, which causes exfoliation and a property change on the photoconductive film 6 during laser cut, appears substantially at the center of the pixel electrode 11 without affecting an adjacent pixel.

Therefore, in the present embodiment, a pixel defect correcting part is subjected to spot radiation of laser; thus, even when the connecting electrode 13 as a pixel defect correcting part is cut, it is possible to minimize the influence of the damage that is exerted on an adjacent pixel.

At this point, without changing the fundamental structure of the active-matrix substrate 10a, only if the layout of the storage capacitor 25 is changed, it is possible to dispose the connecting electrode 13 serving as a pixel defect correcting part substantially at the center of the pixel electrode 11.

Here, as shown in FIG. 9, the layout of the connecting electrode 13 and the storage capacitor 25 on the active-matrix substrate 20a is one of examples achieving the above effect. Thus, the layout is not limited as long as a pixel defect correcting part is dispose d substantially at the center of the pixel electrode 11.

Figure 10:
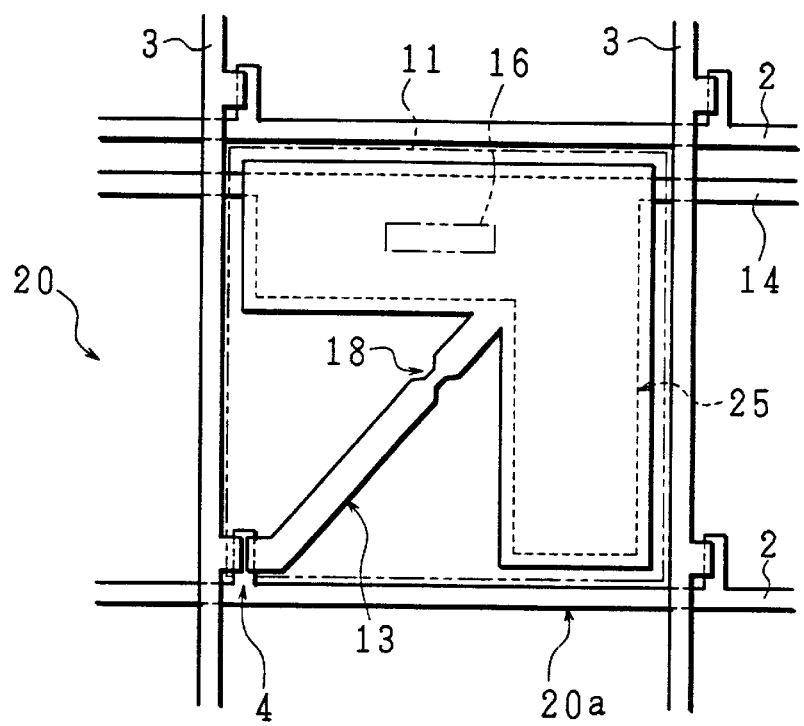
FIG. 10 is a plan view showing a construction in which a restriction is provided on a connecting electrode in the active-matrix substrate and the flat-panel image sensor of FIG. 8.

Moreover, a s shown in FIG. 10, a pixel defect correcting part of the connecting electrode 13 is formed into the restriction 18, so that a pixel defect correcting part to be cut by laser radiation can be identified at a glance. Further, the electrode is thin at the restriction 18, so that the electrode can be readily cut by laser radiation and correction can be positively made in a simple manner. Here, the shape of the pixel defect correcting part is not limited to a restriction. For example, as shown in FIGS. 17(b) to 17(e), the connecting electrode 13 only needs to be thinner than adjacent parts by forming a chipped part on the electrode.

Figure 11:
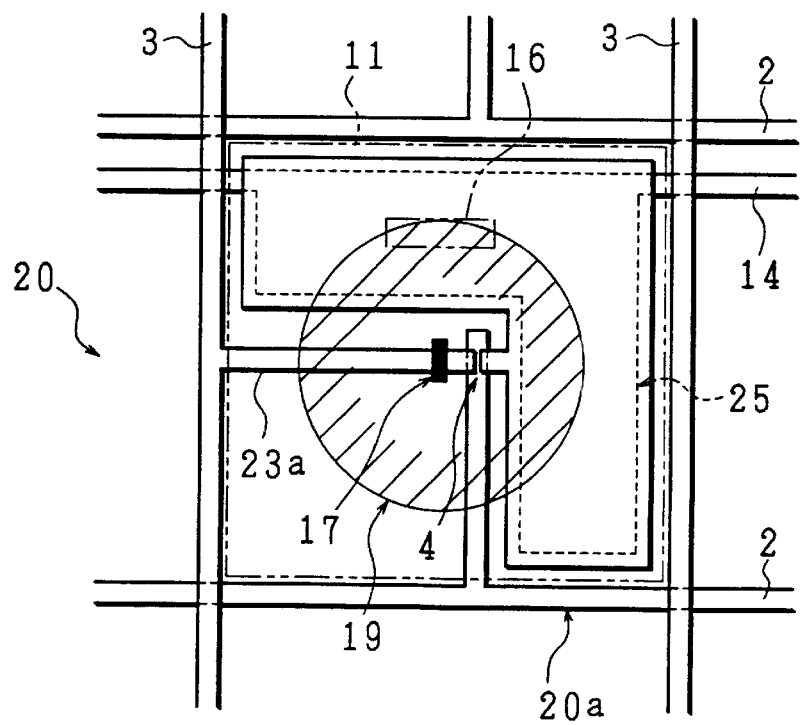
FIG. 11 is a plan view showing a construction in which a pixel defect correcting part is provided on a connecting part between a data electrode and a thin-film transistor in the active-matrix substrate and the flat-panel image sensor of FIG. 8.

Moreover, the pixel defect correcting part is not limited to the connecting electrode 13 connecting the thin-film transistor 4 and the pixel electrode 11 in the present embodiment. For example, as shown in FIG. 11, a connecting part 23a between the thin-film transistor 4 and the data electrode 3 is also available. In other words, in order to prevent unnecessary leakage of electrical charge from the pixel electrode 11 to the data electrode 3, it is effective to cut the connecting part 23a, which is a part of a conducting path having a long length between the data electrode 3 and the pixel electrode 11.

As mentioned above, any shape is applicable for a pixel defect correcting part as long as an electrode such as the connecting electrode 13 can be readily cut and correction can be readily made in a positive manner.

Here, in FIG. 11, a layout is adopted in which the thin-film transistor 4 is disposed substantially at the center of the pixel electrode 11, in order to dispose the laser cut point 17 substantially at the center of the pixel electrode 11.

Meanwhile, in FIG. 11 as well, it is effective to form a pixel defect correcting part into a restriction.

As described above, the active-matrix substrate 20a and the flat-panel image sensor 20 of the present embodiment include the connecting electrode 13 substantially at the center of the pixel electrode 11.

Namely, when the connecting electrode 13 is subjected to spot radiation of laser, the connecting electrode 13 is cut with laser energy. In this case, an adjacent pixel may be affected by the laser energy and become defective.

However, the active-matrix substrate 20a and the flat-panel image sensor 20 of the present embodiment include the connecting electrode 13 or the connecting part 23a as a pixel defect correcting part substantially at the center of the pixel electrode 11.

Therefore, the connecting electrode 13 or the connecting part 23a is subjected to spot radiation of laser; thus, even when the connecting electrode 13 or the connecting part 23a is cut, it is possible to minimize the influence of the damage that is exerted on an adjacent pixel. Namely, laser energy is confined within the pixel, so that an adjacent pixel is not affected.

For example, when the active-matrix substrate 20a is provided in the flat-panel image sensor 20, damage causing exfoliation and a property defect spreads around the center of a laser spot on the photoconductive film 6 on the active-matrix substrate 20a. Hence, if the damage on the photoconductive film 6 spreads to an adjacent pixel, the adjacent pixel may also become defective.

However, in the present embodiment, the connecting electrode 13 or the connecting part 23a is disposed substantially at the center of the pixel electrode 11. Thus, it is possible to minimize the influence of damage on the photoconductive film 6 that is exerted on an adjacent pixel.

As a result, it is possible to provide the active-matrix substrate 20a and the flat-panel image sensor 20, that can readily suppress leakage of unnecessary electrical charge with ease from a pixel defect, which may cause a line defect.

Further, in the active-matrix substrate 20a and the flat-panel image sensor 20 of the present embodiment, the storage capacitor 25 is partially disposed in a rectangular area composed of electrode wires arranged in a lattice form, so that the connecting electrode 13 or the connecting part 23a is disposed substantially at the center of the pixel electrode 11. Here, when the storage capacitor 25 is partially disposed, the storage capacitor 5 is normally made up of the rectangular Cs electrode 14, which is substantially equal to the pixel electrode 11 in shape. For example, when the Cs electrode 14 is formed into an L shape, the storage capacitor 25 is also formed into the L shape. Therefore, the storage capacitor 25 is partially disposed.

With this arrangement, the connecting electrode 13 or the connecting part 23a is disposed substantially at the center of the pixel electrode 11, so that a pixel defect can be corrected without affecting an adjacent pixel.

Consequently, without changing the fundamental structure of the active-matrix substrate 10a, only if the layout of the storage capacitor 25 is changed, it is possible to dispose the connecting electrode 13 or the connecting part 23a substantially at the center of the pixel electrode 11.

Hence, it is possible to provide the active-matrix substrate 20a and the flat-panel image sensor 20, that can positively suppress leakage of unnecessary electrical charge with ease from a pixel defect, which may cause a line defect.

Incidentally, when a pixel defect correcting part is subjected to spot radiation of laser, the laser cut point 17 on the connecting electrode 13 is cut by laser energy. In this case, damage causing exfoliation and a property defect spreads around the center of a laser spot on the photoconductive film 6, which is formed on the active-matrix substrate 10a in the flat-panel image sensor 10. Hence, if the damage on the photoconductive film 6 spreads to an adjacent pixel, the adjacent pixel may also become defective.

However, with the pixel defect correcting method of the flat-panel image sensor 20 according to the present embodiment, when a pixel defect of the flat-panel image sensor 20 is corrected, the connecting electrode 13 disposed substantially at the center of the pixel electrode 11 is cut by laser radiation.

With this method, even when the connecting electrode 13 is cut by spot radiation of laser, it is possible to minimize the influence of the damage that is exerted on an adjacent pixel.

Consequently, it is possible to provide a pixel defect correcting method of the flat-panel image sensor 20, that can readily and efficiently suppress leakage of unnecessary electrical charge from a pixel defect, which may cause a line defect.

EMBODIMENT 3

Referring to FIGS. 12 to 15, the following discusses still another embodiment of the present invention. Here, for convenience of explanation, those members that have the same functions as those shown in the figures of Embodiment 1 and Embodiment 2 are indicated by the same reference numerals and the explanation thereof is omitted.

Figure 12:
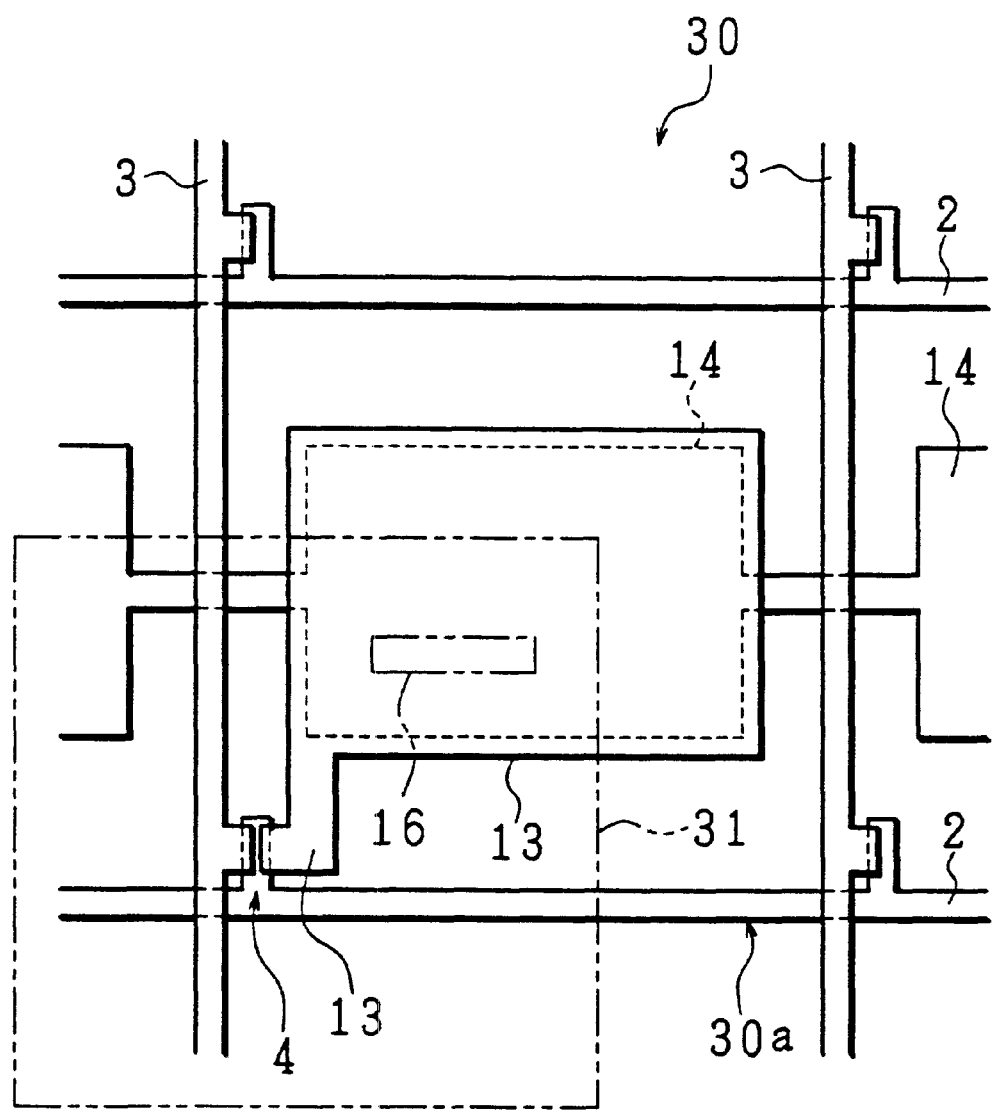
FIG. 12 is a plan view showing still another embodiment of the active-matrix substrate and the flat-panel image sensor according to the present invention, in which a barycenter of a rectangular area, which is composed of electrode wires arranged in a lattice form, is relatively shifted from a barycenter of a rectangular area composed of a pixel electrode so as to dispose a pixel defect correcting part substantially at the center of the pixel electrode.

As shown in FIG. 12, an active-matrix substrate 30a of a flat-panel image sensor 30 according to the present embodiment is characterized in that a barycenter of a rectangular area, which is composed of electrode wires having gate electrodes 2 and data electrodes 3 arranged in a lattice form, is relatively shifted from a barycenter of a rectangular area composed of a pixel electrode 31.

To be specific, based on the active-matrix substrate 10a shown in FIGS. 4(a) and 4(b) of Embodiment 1, the position of the pixel electrode 31 is shifted so as to dispose a connecting electrode 13 as a pixel defect correcting part substantially at the center of the pixel electrode 31.

Figure 13:
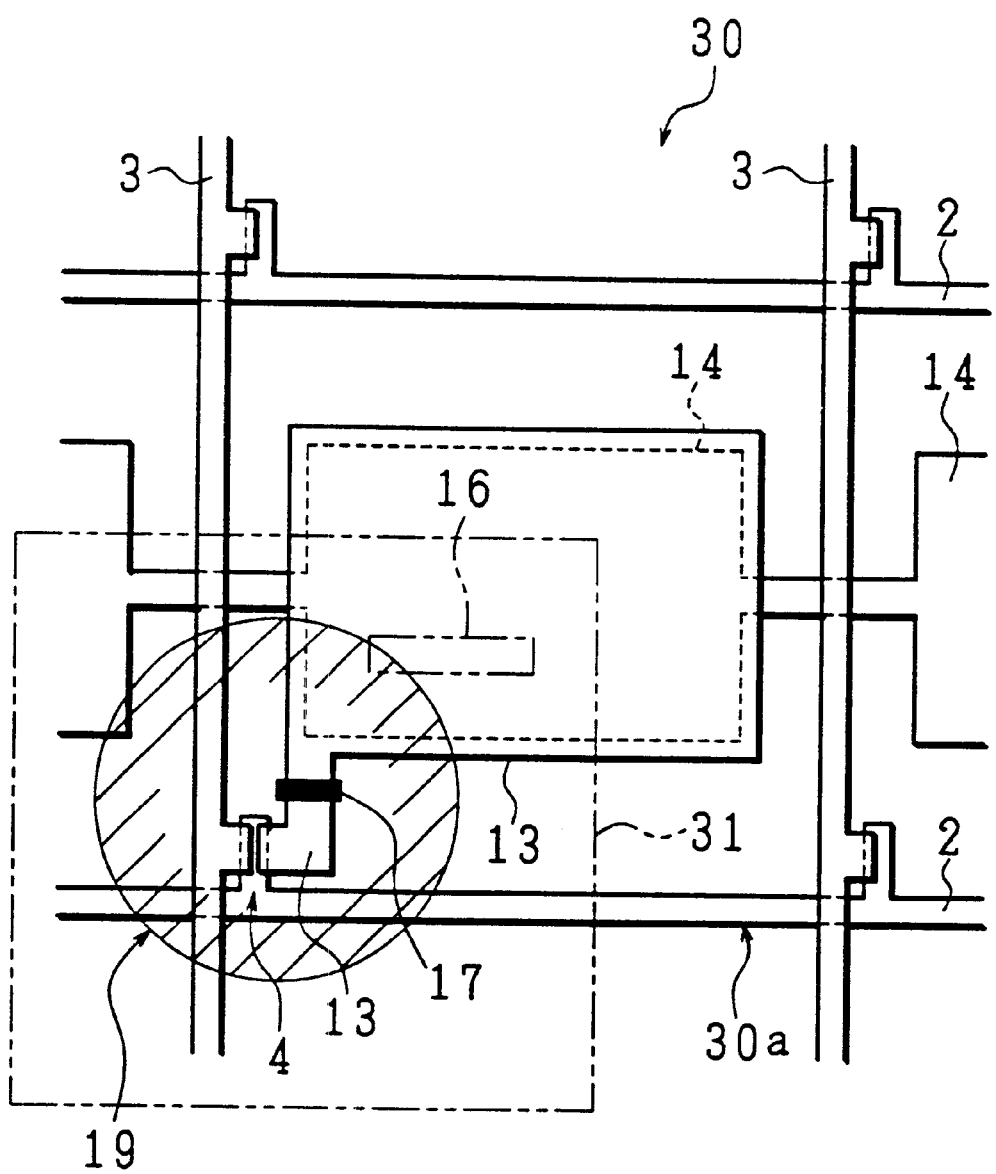
FIG. 13 is a plan view showing a damaged area on the photoconductive film when the pixel defect correcting part is cut by laser on the active-matrix substrate of FIG. 12.

When a pixel defect appears on the active-matrix substrate 30a of the flat-panel image sensor 30, as shown by a solid line of FIG. 13, a laser cut point 17 on the connecting electrode 13 is subjected to spot radiation of YAG laser from the back of the active-matrix substrate 30a through a glass substrate 1 serving as a base of the active-matrix substrate 30a, so that the connecting electrode 13 is cut and correction is made.

With this arrangement, electrical charge generated in a photoconductive film 6 made of a-Se or electrical charge caused by a defect on the photoconductive film 6 can be prevented from leaking to the data electrodes 3 via thin-film transistors 4. Consequently, it is confirmed that a defect recognized as a line defect before correction is corrected to a pixel defect (point defect) on a single pixel, so that the defect becomes more unnoticeable. Furthermore, it is confirmed that defect correction can be readily made by image data processing.

Besides, in the present embodiment, as shown in FIG. 13, it is confirmed that a damage area 19 causing exfoliation and a property change on the conductive film 6 during laser cutting is generated substantially at the center of the pixel electrode 31 so that an adjacent pixel is not affected.

Hence, in the present embodiment, a pixel defect correcting part is subjected to spot radiation of laser; thus, even when the pixel defect correcting part is cut, it is possible to minimize the influence of the damage that is exerted on an adjacent pixel.

At this time, without changing the fundamental construction of the active-matrix substrate 30a, only if the layout of the pixel electrode 31 is changed, it is possible to dispose the connecting electrode 13 serving as a pixel defect correcting part substantially at the center of the pixel electrode 31.

Here, the layout of the members on the active-matrix substrate 30a is one of examples achieving the above effect. Thus, the layout is not limited as long as a pixel defect correcting part is disposed substantially at the center of the pixel electrode 31.

Also, in the active-matrix substrate 30a, the pixel electrode 31 is formed on an interlayer insulating film 12, which is made of an organic material and is formed on electrode wires arranged in a lattice form and a thin-film transistor 4. Here, it is possible to adopt the interlayer insulating film 12, which is made of a material such as acrylic and polyimide composed of organic materials, with a relatively small relative dielectric constant of about 3.

Furthermore, the interlayer insulating film 12 can be formed with a thickness of the order of $\mu$m by spin coating and laminating. For this reason, it is possible to reduce parasitic capacity appearing between the pixel electrode 31 and the electrode wires arranged in a lattice form and parasitic capacity appearing between the pixel electrode 31 and the thin-film transistor 4.

Hence, the pixel electrode 31 is disposed so as to overlap the electrode wires formed in a lattice form and the thin-film transistor 4, thereby increasing a degree of freedom on design.

Also, the above effect is not limited to the present embodiment. In Embodiments 1 and 2 as well, the above effect is advantageous to a design layout in which the pixel electrode 11 overlaps the electrode wires formed in a lattice form in order to improve a fill factor of the pixel electrode 11.

Figure 14:
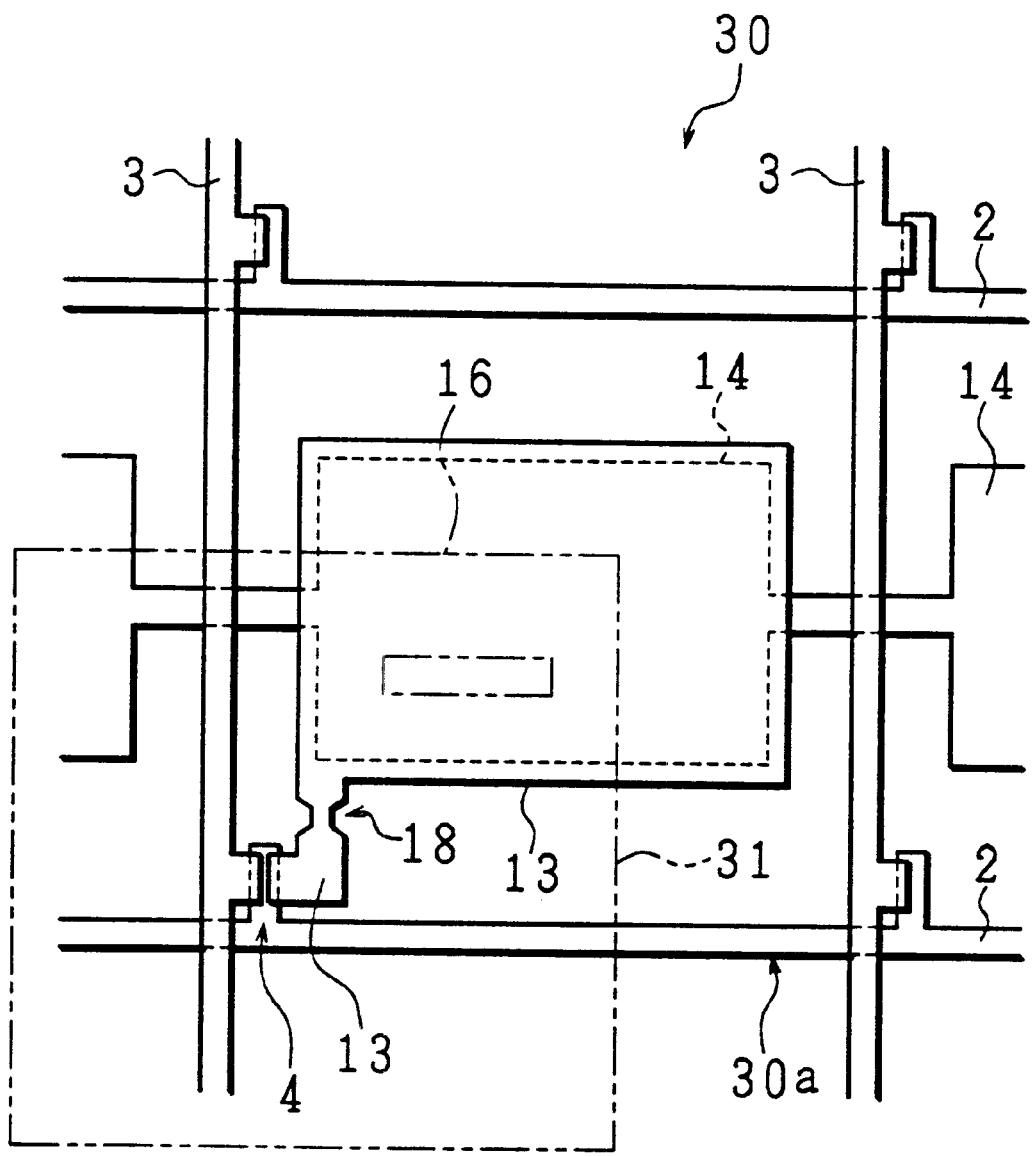
FIG. 14 is a plan view showing a construction in which a restriction is formed on a connecting electrode in the active-matrix substrate and the flat-panel image sensor of FIG. 12.

Meanwhile, as shown in FIG. 14, a pixel defect correcting part of the connecting electrode 13 is formed into a restriction 18, so that a pixel defect correcting part to be cut by laser radiation can be identified at a glance. Further, the electrode is thin at the restriction 18, so that the electrode can be readily cut by laser radiation and correction can be positively made in a simple manner. Here, the shape of the pixel defect correcting part is not limited to a restriction. For example, as shown in FIGS. 17(b) to 17(e), the connecting electrode 13 only needs to be thinner than adjacent parts by forming a chipped part on the electrode. Namely, a pixel defect correcting part can be formed into any shape as long as electrodes such as the connecting electrode 13 can be readily cut by laser radiation and correction can be positively made in a simple manner.

Figure 15:
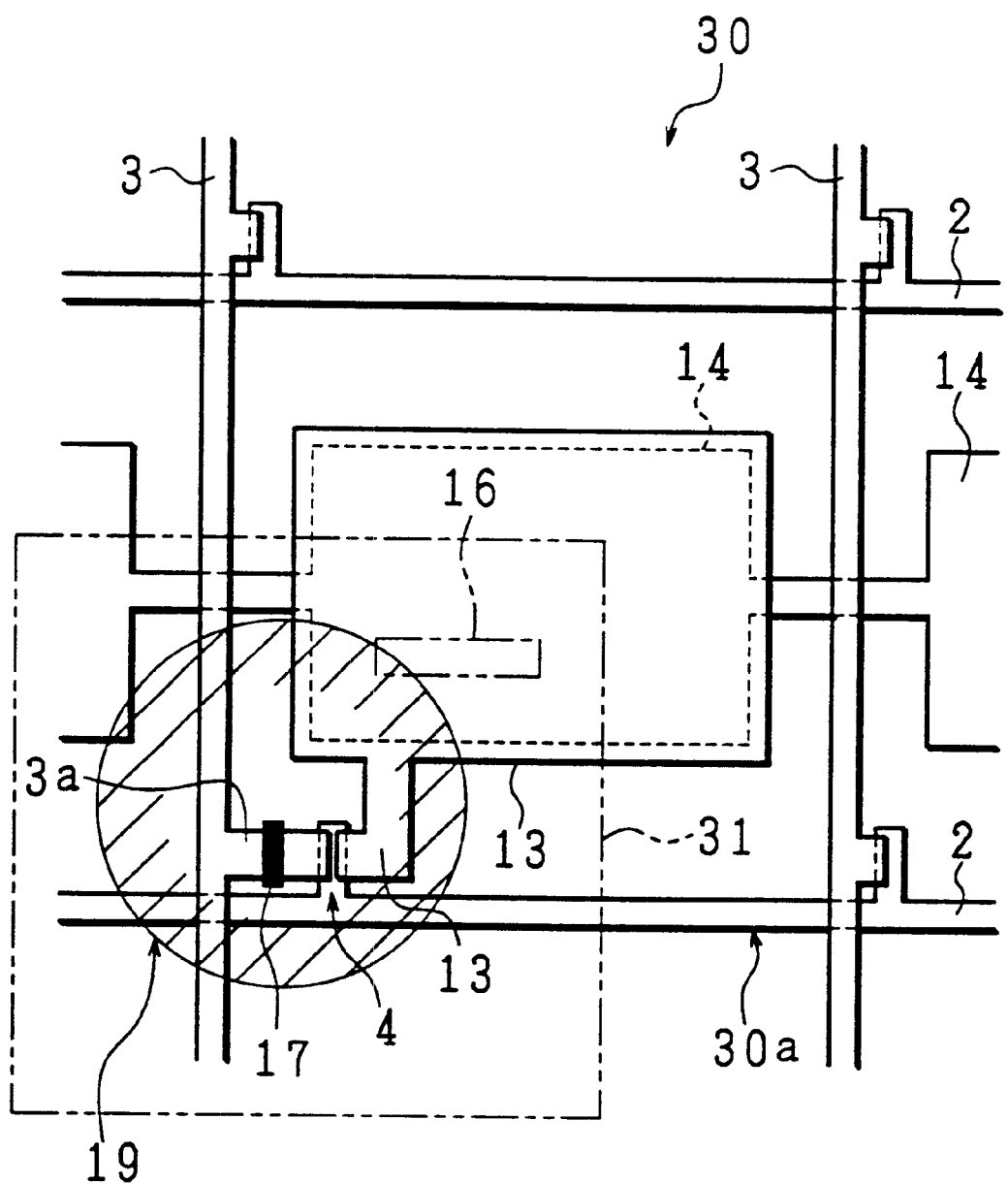
FIG. 15 is a plan view showing a construction in which a pixel defect correcting part is provided on a connecting part between a data electrode and a thin-film transistor in the active-matrix substrate and the flat-panel image sensor of FIG. 12.

Moreover, the position of the pixel defect correcting part is not limited to the connecting electrode 13 connecting the thin-film transistor 4 and the pixel electrode 31. For example, as shown in FIG. 15, a connecting part 3a connecting the thin-film transistor 4 and the data electrode 3 is also available. In other words, in order to prevent unnecessary leakage of electrical charge from the pixel electrode 31 to the data electrode 3, it is effective to cut a part of a conductive path between the data electrode 3 and the pixel electrode 31. Here, in FIG. 15 as well, it is effective to form the laser cut point 17 serving as a pixel defect correcting part into a restriction.

As described above, the rectangular area composed of the pixel electrode 31 is relatively shifted so as to dispose the connecting electrode 13 or the connecting part 3a as a pixel defect correcting part substantially at the center of the pixel electrode 31. Thus, a pixel defect can be corrected without affecting an adjacent pixel.

Therefore, without changing the fundamental construction of the active-matrix substrate 30a and the flat-panel image sensor 30, only if the layout of the pixel electrode 31 is changed, it is possible to dispose the connecting electrode 13 or the connecting part 3a substantially at the center of the pixel electrode 31.

Consequently, it is possible to provide the active-matrix substrate 30a and the flat-panel image sensor 30, that can positively suppress leakage of unnecessary electrical charge with ease from a pixel defect, which may cause a line defect.

EMBODIMENT 4

Figure 16:
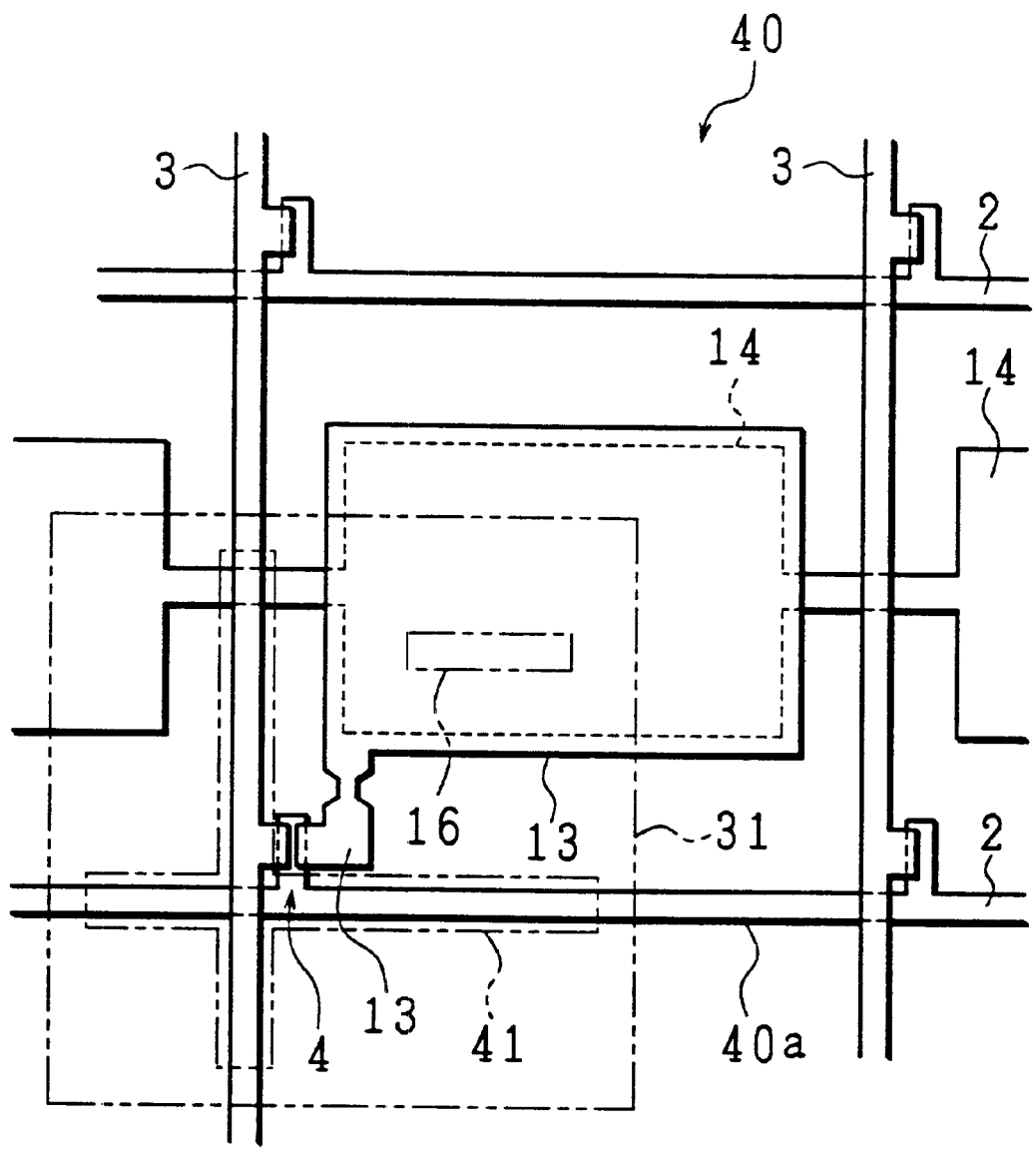
FIG. 16 is a plan view showing still another embodiment of the active-matrix substrate and the flat-panel image sensor according to the present invention, in which an opening is formed on an area where electrode wires arranged in a lattice form overlap a pixel electrode of the active-matrix substrate shown in FIG. 12.

Referring to FIG. 16, the following discusses still another embodiment of the present invention. Here, for convenience of explanation, those members that have the same functions as those shown in the figures of Embodiments 1 to 3 are indicated by the same reference numerals and the explanation thereof is omitted.

As shown in FIG. 16, an active-matrix substrate 40a in a flat-panel image sensor 40 of the present embodiment is identical to the active-matrix substrate 30a of Embodiment 3 in layout of members on a substrate, except that an opening 41 is formed on a pixel electrode 31.

Namely, as shown in FIG. 16, the active-matrix substrate 40a of the present embodiment is characterized in that the opening 41 is formed on the pixel electrode 31 on a part of an area where a pixel area 31 overlaps electrode wires having gate electrodes 2 and data electrodes 3 formed in a lattice form.

It is therefore possible to further reduce parasitic capacity caused by the overlapping of the pixel electrode 31 and electrode wires arranged in a lattice form.

Particularly when the active-matrix substrate 40a is used in the flat-panel image sensor 40, if the data electrodes 3 have a large parasitic capacity, noise increases on the data electrode 3, thereby reducing S/N of a pickup signal. Hence, the present construction for reducing a parasitic capacity is quite effective.

As earlier mentioned, in the active-matrix substrate 40a and the flat-panel image sensor 40 of the present embodiment, the opening 41 is formed on the pixel electrode 31 on an area where the pixel electrode 31 overlaps the gate electrodes 2 and the data electrodes 3 formed into a lattice form.

Therefore, it is possible to reduce parasitic capacity caused by the overlapping of the pixel electrode 31 and the electrode wires arranged in a lattice form.

Particularly when the active-matrix substrate 40a is used in the flat-panel image sensor 40, if the data electrodes 3 have a large parasitic capacity, noise increases on the data electrodes 3, thereby reducing S/N of a pickup signal. Hence, the present construction for reducing a parasitic capacity is quite effective in the flat-panel image sensor 40.

As described above, an active-matrix substrate of the present invention, including: electrode wires having gate electrodes such as scanning lines and data electrodes such as signal lines arranged in a lattice form, switching elements such as thin-film transistors (TFT) disposed respectively at intersections of the lattice form, a pixel electrode connected to the data electrodes via the switching elements, and a storage capacitor connected to the pixel electrode, wherein a pixel defect correcting part is provided on a part of an electrode connecting the data electrodes and the pixel electrode.

Namely, the active-matrix substrate includes the electrode wires having the gate electrodes such as scanning lines and data electrodes such as signal lines arranged in a lattice form, the switching elements such as thin-film transistors (TFT) disposed respectively at intersections of the lattice form, the pixel electrode connected to the data electrodes via the switching element, and the storage capacitor connected to the pixel electrode.

Therefore, when the active-matrix substrate is used as a display device, the gate electrode of the corresponding scanning line, etc. is selected and a gate voltage is applied to the switching elements such as the thin-film transistors (TFT) connected to the corresponding pixel electrode, so that an information signal is applied from the data electrode such as a signal line to the pixel electrode and electrical charge is accumulated in the storage capacitor so as to display the pixel.

Meanwhile, when the active-matrix substrate is used as a two-dimensional image detector, if an X-ray and the like is emitted to the corresponding pixel from outside, electrical charge is accumulated in the storage capacitor via a photoconductive layer. Therefore, the gate electrode of the corresponding scanning line, etc. is selected and a gate voltage is applied to the switching elements such as thin-film transistors (TFT) connected to pixel electrode of the pixel, so that an information signal based on electrical charge accumulated in the storage capacitor is applied to the data electrode such as the signal line and is outputted to the outside.

Here, in the present invention, the pixel defect correcting part is provided on a part of an electrode connecting the data electrode and the pixel electrode.

Hence, the pixel defect correcting part is subjected to spot radiation of laser from the back of the active-matrix substrate, so that the pixel defect correcting part can be readily cut.

Thus, in the two-dimensional image detector and the like including the photoconductive layer on the active-matrix substrate, it is possible to prevent unnecessary electrical charge caused by a pixel defect from leaking through the switching elements to the data electrode.

As a result, a defect recognized as a line defect before correction is corrected to a pixel defect (point defect) on a single pixel, so that the defect becomes more unnoticeable. Furthermore, a defect can be readily corrected by image data processing.

Consequently, it is possible to provide the active-matrix substrate which can readily suppress leakage of unnecessary electrical charge from a pixel defect, which may cause a line defect.

Further, the active-matrix substrate preferably includes a pixel defect correcting part substantially at the center of the pixel electrode.

In other words, when a pixel defect correcting part is subjected to spot radiation of laser, the pixel defect corresponding part is cut by laser energy. In this case, laser energy may spread to an adjacent pixel and the adjacent pixel may become defective.

However, according to the present invention, a pixel defect correcting part is provided substantially at the center of the pixel electrode.

Therefore, even when a pixel defect correcting part is subjected to spot radiation of laser to cut the pixel defect correcting part, it is possible to minimize the influence of the damage that is exerted on an adjacent pixel. Namely, the laser energy is confined within the pixel without affecting the adjacent pixel.

For example, when the active-matrix substrate is mounted in the two-dimensional image detector, damage causing exfoliation and a property defect spreads around the center of the laser spot on the photoconductive film of the active-matrix substrate. Thus, if the damage on the photoconductive layer spreads to an adjacent pixel, the adjacent pixel may become defective.

However, in the present invention, the pixel defect correcting part is provided substantially at the center of the pixel electrode; thus, it is possible to minimize the influence of the damaged photoconductive layer that is exerted on an adjacent pixel.

Consequently, it is possible to provide the active-matrix substrate which can positively suppress leakage of unnecessary electrical charge with ease from a pixel defect, which may cause a line defect.

The active-matrix substrate is preferably arranged such that the storage capacitor is partially disposed on an area composed of the electrode wires arranged in a lattice form so as to dispose the pixel defect correcting part substantially at the center of the pixel electrode.

The storage capacitor is partially disposed on an area composed of the electrode wires arranged in a lattice form, so that the pixel defect correcting part is disposed substantially at the center of the pixel electrode.

With this arrangement, it is possible to dispose the pixel defect correcting part substantially at the center of the pixel electrode. Hence, a pixel defect can be corrected without affecting an adjacent pixel.

Consequently, without changing the fundamental construction of the active-matrix substrate, only if the layout of the storage capacitor is changed, it is possible to dispose the pixel defect correcting part substantially at the center of the pixel electrode.

As a result, it is possible to provide the active-matrix substrate which can positively suppress leakage of unnecessary electrical charge with ease from a pixel defect, which may cause a line defect.

The active-matrix substrate is preferably arranged such that a barycenter of an area composed of the electrode wires arranged in a lattice form is relatively shifted from a barycenter of an area composed of the pixel electrode, so that the pixel defect correcting part is disposed substantially at the center of the pixel electrode.

Namely, the area composed of the pixel electrode is relatively shifted so as to dispose the pixel defect correcting part substantially at the center of the pixel electrode. Thus, a pixel defect can be corrected without affecting an adjacent pixel.

Consequently, without changing the fundamental construction of the active-matrix substrate, only if the layout of the pixel electrode is changed, it is possible to dispose the pixel defect correcting part substantially at the center of the pixel electrode.

As a result, it is possible to provide the active-matrix substrate which can positively suppress leakage of unnecessary electrical charge with ease from a pixel defect, which may cause a line defect.

The active-matrix substrate is preferably arranged such that an opening is formed on the pixel electrode on an area where the pixel electrode overlaps the electrode wires arranged in a lattice form.

Therefore, the pixel electrode and the electrode wires arranged in a lattice form overlap each other so as to reduce occurring parasitic capacity.

Particularly when the active-matrix substrate is used in the two-dimensional image detector, if the data electrodes have a large parasitic capacity, noise increases on the data electrodes, thereby reducing S/N of a pickup signal. Hence, the present construction for reducing a parasitic capacity is quite effective in the two-dimensional image detector.

The active-matrix substrate is preferably arranged such that the pixel defect correcting part is formed into a restriction.

Hence, it is possible to identify at a glance a pixel defect correcting part to be cut by laser radiation. Further, the electrode is thin at the restriction, so that the electrode can be readily cut by laser radiation and correction can be positively made.

As a result, it is possible to provide the active-matrix substrate which can positively suppress leakage of unnecessary electrical charge with ease from a pixel defect, which may cause a line defect.

Besides, active-matrix substrate is preferably arranged such that an interlayer insulating film made of an organic material is formed between a layer including the pixel electrode and a layer including the pixel defect correcting part, and the pixel electrode is connected to the layer including the pixel defect correcting part via a contact hole formed in the interlayer insulating film.

Therefore, the pixel defect correcting part is subjected to spot radiation of laser, so that the influence of damage can be minimized on the highest layer of a surface of the active-matrix substrate even when the pixel defect correcting part is cut. Hence, it is also possible to minimize the influence exerted on films formed on the active-matrix substrate.

For example, in the case of the two-dimensional image detector including the photoconductive layer on the active-matrix substrate, when the pixel defect correcting part is subjected to spot radiation of laser, the pixel defect correcting part is cut by laser energy and physical influence is accordingly exerted on the photoconductive film on the active-matrix substrate, thereby causing exfoliation, a property change, etc. on the photoconductive film.

However, the interlayer insulating film made of an organic material is formed on the layer including the pixel defect correcting part, so that damage sustained by the photoconductive film is reduced by the interlayer insulating film.

Consequently, it is possible to provide the active-matrix substrate which can efficiently suppress leakage of unnecessary electrical charge from a pixel defect, which may cause a line defect.

The active-matrix substrate is preferably arranged such that the pixel electrode is formed on the interlayer insulating film made of an organic material on the switching element and the electrode wires arranged in a lattice form.

According to this arrangement, the interlayer insulating film made of an organic material can be formed with a thickness of the order of Am by spin coating and laminating. For this reason, it is possible to reduce parasitic capacity appearing between the pixel electrode and the electrode wires arranged in a lattice form, and parasitic capacity appearing between the pixel electrode and the switching elements.

Hence, the pixel electrode is disposed so as to overlap the electrode wires arranged in a lattice form and the switching element, thereby increasing a degree of freedom on design.

Consequently, it is possible to provide the active-matrix substrate which can positively suppress leakage of unnecessary electrical charge with ease from a pixel defect, which may cause a line defect.

The two-dimensional image detector of the present invention is preferably arranged such that the photoconductive layer is formed on the active-matrix substrate.

This arrangement makes it possible to prevent unnecessary electrical charge caused by a pixel defect from leaking to the data electrodes through the switching elements.

As a result, a defect recognized as a line defect before correction is corrected to a pixel defect (point defect) on a single pixel, so that the defect becomes more unnoticeable. Furthermore, a defect can be readily corrected by image data processing.

Consequently, it is possible to provide the two-dimensional image detector which can positively suppress leakage of unnecessary electrical charge with ease from a pixel defect, which may cause a line defect.

Further, the two-dimensional image detector is preferably arranged such that the photoconductive layer is a semiconductor layer whose main component is selenium (Se) such as a-Se (amorphous selenium).

Namely, for example, a semiconductor layer whose main component is selenium (Se) such as a-Se can be formed into a film at a low temperature (room temperature) by vacuum deposition and therefore can be formed into a film directly on the active-matrix substrate.

Consequently, it is possible to readily provide the two-dimensional image detector which can positively suppress leakage of unnecessary electrical charge with ease from a pixel defect, which may cause a line defect.

Additionally, for example, regarding the semiconductor layer whose main component is selenium (Se) such as a-Se, it has been known that crystallization is accelerated at 60 to 80° C. or more, causing degradation in property. Moreover, a thermal expansion coefficient thereof is larger than that of a glass substrate. Hence, when laser correction is made on the active-matrix substrate of the two-dimensional detector, the semiconductor layer whose main component is selenium (Se) such as a-Se is susceptible to damage.

Meanwhile, with the active-matrix substrate including the pixel defect correcting part substantially at the center of the pixel electrode, even in the case of laser correction, it is possible to minimize the influence of the damaged semiconductor layer, whose main component is selenium (Se) such as a-Se, to an adjacent pixel.

A pixel defect correcting method of the two-dimensional image detector according to the present invention, the detector provided with a) the active-matrix substrate including the electrode wires having the gate electrodes and the data electrodes arranged in a lattice form, a plurality of the switching elements formed respectively at intersections of the lattice form, the pixel electrode connected to the data electrodes via the switching elements, and a storage capacitor connected to the pixel electrodes; and b) the photoconductive layer formed on the active-matrix substrate, the method including the step of cutting a pixel defect correcting part formed on a part of an electrode connecting the data electrode and the pixel electrode.

In the two-dimensional image detector, which is provided with a) the active-matrix substrate including the electrode wires having the gate electrodes and the data electrodes arranged in a lattice form, a plurality of the switching elements formed respectively at intersections of the lattice form, the pixel electrode connected to the data electrodes via the switching elements, and a storage capacitor connected to the pixel electrode; and b) the photoconductive layer formed on the active-matrix substrate, when correcting a pixel defect, a pixel defect correcting part is cut, which is provided on a part of an electrode connecting the data electrodes and the pixel electrode.

This arrangement makes it possible to prevent unnecessary electrical charge caused by a pixel defect from leaking to the data electrode through switching elements.

Consequently, a defect recognized as a line defect before correction is corrected to a pixel defect (point defect) on a single pixel, so that the defect becomes more unnoticeable. Furthermore, a defect can be readily corrected by image data processing.

As a result, it is possible to provide a pixel defect correcting method of the two-dimensional image detector that can readily suppress leakage of unnecessary electrical charge from a pixel defect, which may cause a line defect.

Also, the pixel defect correcting method of the two-dimensional image detector is preferably arranged such that the pixel defect correcting part provided substantially at the center of the pixel electrode is cut by laser radiation.

Namely, when the pixel defect correcting part is subjected to spot radiation of laser, the pixel defect correcting part is cut by laser energy. At this time, damage such as exfoliation and a property defect spreads around the center of the laser spot on the photoconductive layer provided on the active-matrix substrate of the two-dimensional image detector. When the damage on the photoconductive layer spreads to an adjacent pixel, the adjacent pixel may become defective.

However, when correcting a pixel defect of the two-dimensional image detector, a pixel defect correcting part provided substantially at the center of the pixel electrode is cut by laser radiation.

With this arrangement, even when the pixel defect correcting part is cut by spot radiation of laser, it is possible to minimize the influence of the damage that is exerted on the adjacent pixel.

Consequently, it is possible to provide a pixel defect correcting method of the two-dimensional image detector that can efficiently suppress leakage of unnecessary electrical charge with ease from a pixel defect, which may cause a line defect.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An active-matrix substrate, comprising a pixel defect correcting part on a part of an electrode for connecting a data electrode and a pixel electrode, which is connected to said data electrode via switching elements disposed respectively at intersections of gate electrodes and said data electrodes arranged in a lattice form.

2. The active-matrix substrate as defined in claim 1, wherein said pixel defect correcting part is formed by making the electrode for connecting said data electrode and said pixel electrode thinner than adjacent parts.

3. The active-matrix substrate as defined in claim 1, wherein said pixel defect correcting part is formed into a restriction.

4. The active-matrix substrate as defined in claim 1, wherein an interlayer insulating film made of an organic material is provided between a layer including said pixel electrode and a layer including said pixel defect correcting part, and said pixel electrode is connected via a contact hole formed in said interlayer insulating film to the layer including the pixel defect correcting part.

5. The active-matrix substrate as defined in claim 1, wherein said pixel electrode is formed on an interlayer insulating film, which is made of an organic material on said switching elements and electrode wires having said gate electrodes and said data electrodes arranged in a lattice form.

6. The active-matrix substrate as defined in claim 1, wherein said pixel defect correcting part is provided substantially at a center of said pixel electrode.

7. The active-matrix substrate as defined in claim 6, further comprising a storage capacitor which is connected to said pixel electrode and is partially disposed in an area composed of electrode wires having said gate electrodes and said data electrodes arranged in a lattice form such that said pixel defect correcting part is disposed substantially at the center of said pixel electrode.

8. The active-matrix substrate as defined in claim 6, wherein a barycenter of an area composed of said pixel electrode is relatively shifted from a barycenter of an area composed of electrode wires having said gate electrodes and said data electrodes arranged in a lattice form, so as to dispose the pixel defect correcting part substantially at the center of said pixel electrode.

9. The active-matrix substrate as defined in claim 8, wherein an opening is formed on said pixel electrode on an area where said pixel electrode and said electrode wires arranged in a lattice form overlap each other.

10. A two-dimensional image detector comprising a photoconductive layer on an active-matrix substrate including a pixel defect correcting part on a part of an electrode for connecting a data electrode and a pixel electrode, which is connected to said data electrode via switching electrodes provided respectively at intersections of said gate electrodes and said data electrodes arranged in a lattice form.

11. The two-dimensional image detector as defined in claim 10, wherein said pixel defect correcting part is provided substantially at a center of said pixel electrode.

12. The two-dimensional image detector as defined in claim 11, further comprising a storage capacitor partially disposed on an area composed of electrode wires having said gate electrodes and data electrodes arranged in a lattice form such that said pixel defect correcting part is disposed substantially at the center of said pixel electrode.

13. The two-dimensional image detector as defined in claim 11, wherein a barycenter of an area composed of said pixel electrode is relatively shifted from a barycenter of an area composed of electrode wires having said gate electrodes and said data electrodes arranged in a lattice form, so as to dispose the pixel defect correcting part substantially at the center of said pixel electrode.

14. The two-dimensional image detector as defined in claim 13, wherein an opening is formed on said pixel electrode on an area where said pixel electrode and said electrode wires arranged in a lattice form overlap each other.

15. The two-dimensional image detector as defined in claim 10, wherein said pixel defect correcting part is formed by making the electrode for connecting said data electrode and said pixel electrode thinner than adjacent parts.

16. The two-dimensional image detector as defined in claim 15, wherein said pixel defect correcting part is formed into a restriction.

17. The two-dimensional image detector as defined in claim 10, wherein an interlayer insulating film made of an organic material is provided between a layer including said pixel electrode and a layer including said pixel defect correcting part, and said pixel electrode is connected via a contact hole formed in said interlayer insulating film to the layer including the pixel defect correcting part.

18. The two-dimensional image detector as defined in claim 10, wherein said pixel electrode is formed on an interlayer insulating film, which is made of an organic material on said switching elements and electrode wires having said gate electrodes and said data electrodes arranged in a lattice form.

19. The two-dimensional image detector as defined in claim 10, wherein said photoconductive layer is a semiconductor layer whose main component is selenium (Se).

20. A pixel defect correcting method for a two-dimensional image detector comprising the step of cutting a pixel defect correcting part provided on a part of an electrode for connecting a data electrode and a pixel electrode, which is connected to said data electrode via switching electrodes provided respectively at intersections of gate electrodes and data electrodes arranged in a lattice form.

21. The pixel defect correcting method for the two-dimensional image detector as defined in claim 20, wherein said pixel defect correcting part substantially at a center of said pixel electrode is cut by laser.

* * * * *